(12) United States Patent
Chung et al.

(10) Patent No.: US 12,040,286 B2
(45) Date of Patent: Jul. 16, 2024

(54) INNOVATIVE FAN-OUT PANEL LEVEL PACKAGE (FOPLP) WARPAGE CONTROL

(71) Applicant: Intel Corporation, Santa Clara, CA (US)

(72) Inventors: Eunyong Chung, Busan (KR); Moon Young Jang, Busan (KR)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/886,380

(22) Filed: Aug. 11, 2022

(65) Prior Publication Data

US 2022/0384365 A1 Dec. 1, 2022

Related U.S. Application Data

(63) Continuation of application No. 15/969,564, filed on May 2, 2018, now Pat. No. 11,450,620.

(51) Int. Cl.
*H01L 23/00* (2006.01)
*H01L 21/02* (2006.01)
(Continued)

(52) U.S. Cl.
CPC ...... *H01L 23/562* (2013.01); *H01L 21/02362* (2013.01); *H01L 21/565* (2013.01);
(Continued)

(58) Field of Classification Search
CPC ....... H01L 2224/02379; H01L 25/0655; H01L 2924/3511; H01L 23/562; H01L 24/19;
(Continued)

(56) References Cited

U.S. PATENT DOCUMENTS 9,653,391 B1 5/2017 Yew
9,831,195 B1 11/2017 Lu
(Continued)

FOREIGN PATENT DOCUMENTS

KR 10-0671748 1/2007

OTHER PUBLICATIONS

International Search Report and Written Opinion for International Patent Application No. PCT/US2019/025549, mailed Jul. 19, 2019, 11 pages.

(Continued)

*Primary Examiner* — John A Bodnar
(74) *Attorney, Agent, or Firm* — Schwabe, Williamson & Wyatt, P.C.

(57) ABSTRACT

Fan-out panel level packages (FOPLPs) comprising warpage control structures and techniques of formation are described. An FOPLP may comprise one or more redistribution layers; a semiconductor die on the one or more redistribution layers; one or more warpage control structures adjacently located next to the semiconductor die; and a mold compound encapsulating the semiconductor die and the one or more warpage control structures on the one or more redistribution layers. The FOPLP can be coupled a board (e.g., a printed circuit board, etc.). The warpage control structures can assist with minimizing or eliminating unwanted warpage, which can occur during or after formation of an FOPLP or a packaged system. In this way, the warpage control structures can assist with reducing costs associated with semiconductor packaging and/or manufacturing of an FOPLP or a packaged system.

22 Claims, 18 Drawing Sheets

(51) Int. Cl.
  *H01L 21/56* (2006.01)
  *H01L 21/67* (2006.01)
  *H01L 23/31* (2006.01)
  *H01L 25/065* (2023.01)
  *H05K 1/18* (2006.01)

(52) U.S. Cl.
  CPC .... *H01L 21/67288* (2013.01); *H01L 23/3128* (2013.01); *H01L 24/09* (2013.01); *H01L 24/17* (2013.01); *H01L 25/0655* (2013.01); *H05K 1/181* (2013.01); *H01L 2224/02379* (2013.01); *H01L 2924/3511* (2013.01)

(58) Field of Classification Search
  CPC ......... H01L 24/20; H01L 2224/32175–32183; H01L 23/5383; H01L 23/5384; H01L 23/3585; H01L 23/5389; H01L 23/31; H01L 23/28; H01L 23/3107; H01L 23/3114; H01L 23/3121; H01L 2924/181; H01L 21/56; H05K 1/181
  See application file for complete search history.

(56) References Cited

U.S. PATENT DOCUMENTS

| | | |
|---|---|---|
| 2011/0037155 A1 | 2/2011 | Pagaila |
| 2012/0018871 A1 | 1/2012 | Lee et al. |
| 2012/0038047 A1 | 2/2012 | Do |
| 2014/0103517 A1 | 4/2014 | Park et al. |
| 2014/0131858 A1 | 5/2014 | Pan |
| 2015/0008583 A1 | 1/2015 | Gerber |
| 2015/0021754 A1 | 1/2015 | Lin |
| 2016/0374210 A1 | 12/2016 | Marin |
| 2017/0271272 A1 | 9/2017 | Lee |
| 2018/0061788 A1 | 3/2018 | Chang |
| 2018/0122750 A1* | 5/2018 | Lu .................... H01L 23/49822 |
| 2018/0197827 A1 | 7/2018 | Lee |
| 2019/0096825 A1* | 3/2019 | Kim .................... H01L 25/0655 |
| 2019/0122990 A1* | 4/2019 | Shin ....................... H01L 24/92 |

OTHER PUBLICATIONS

International Preliminary Report on Patentability for International Patent Application No. PCT/US2019/025549, mailed Nov. 12, 2020, 8 pages.
Search Report for European Patent Application No. 19796813.4, mailed Apr. 25, 2022, 15 pages.
Office Action for European Patent Application No. 19796813.4, mailed Dec. 1, 2021, 14 pages.
Notice of Allowance from Taiwan Patent Application No. 108111546, mailed Oct. 6, 2023, 3 pgs.

* cited by examiner

INNOVATIVE FAN-OUT PANEL LEVEL PACKAGE (FOPLP) WARPAGE CONTROL

CROSS-REFERENCE TO RELATED APPLICATIONS

This application is a continuation of U.S. patent application Ser. No. 15/969,564, filed on May 2, 2018, the entire contents of which is hereby incorporated by reference herein.

FIELD

Embodiments described herein relate to semiconductor packaging. More particularly embodiments relate to fan-out panel level packaging (FOPLP) technologies.

BACKGROUND INFORMATION

Pressures from advances in packaging technologies are leading to semiconductor dies with higher I/O count. In addition, the shrinking sizes of electronic devices and increasing performance requirements are creating challenges for packaging technologies. FOPLP technologies and fan-out wafer level packaging technologies (FOWLP) are some packaging technologies that can assist with lowering manufacturing costs, reducing sizes of form factors (e.g., package substrates, semiconductor packages, and electronic devices, etc.), and improving performance of form factors (e.g., electrical performance, thermal performance, etc.).

FOWLP has been widely applied, however, its utilization rate and productivity at the wafer level decreases as package sizes increase. Due to this drawback, FOPLP can be more desirable than FOWLP. This is at least because FOPLP includes using a substrate level panel format that can assist with increasing productivity (when compared to FOWLP), which can in turn reduce costs associated with semiconductor packaging and/or manufacturing.

In spite of its benefits, FOPLP has one or more drawbacks. For example, a mold compound used to encapsulate one or more semiconductor dies can assist with creating unwanted warpage during or after formation of an FOPLP. For this example, the warpage can be due to chemical shrinkage of the mold compound. For another example, warpage can be due to mismatches between thermo-mechanical properties of the mold compound, one or more materials used to form the package substrate, and/or the panel.

Proposed solutions that can assist with reducing warpage during or after formation of an FOPLP include using materials that exhibit low chemical shrinkage, that can be cured at low temperatures, and that minimize mismatches between thermo-mechanical properties of the mold compound, one or more materials used to form the package substrate, and/or the panel. These solutions, however, require research and experimentation to determine the appropriate cure temperatures and the appropriate materials that exhibit low chemical shrinkage, that can be cured at low temperatures, and that minimize mismatches between thermo-mechanical properties of the mold compound, one or more materials used to form the package substrate, and/or the panel. Such research and experimentation can increase costs associated with FOPLP.

BRIEF DESCRIPTION OF THE DRAWINGS

Embodiments described herein are illustrated by way of example and not limitation in the figures of the accompanying drawings, in which like references indicate similar features.

DETAILED DESCRIPTION

Embodiments describe fan-out panel level packages (FOPLPs) comprising warpage control structures and techniques of fabricating the FOPLPs. Several advantages are attributable to the embodiments described herein. One advantage is that the embodiments described herein can control warpage by minimizing or eliminating chemical shrinkage that occurs during curing of a mold compound. For one embodiment, warpage can be controlled by configuring and balancing mold volume through use of one or more warpage control structures that are encapsulated by the mold compound. For one embodiment, the warpage control structure(s) are formed from a suitable material (e.g., copper, any other suitable metal, any other combination of suitable metals, any other suitable non-metallic material, any other combination of suitable non-metallic materials, etc.). Furthermore, and for one embodiment, a warpage control structure may be a pillar, a bump, or any other suitable three-dimensional structure. One advantage of controlling warpage using the embodiments described herein is that the metallic structure(s) in an FOPLP can assist with increasing yield loss, while improving productivity during semiconductor packaging and/or manufacturing. One or more of these advantages can assist with reducing costs associated with semiconductor packaging and/or manufacturing.

For one embodiment, an FOPLP may comprise one or more redistribution layers; a semiconductor die on the one or more redistribution layers; one or more warpage control structures adjacently located next to the semiconductor die; and a mold compound encapsulating the semiconductor die and the one or more warpage control structures on the one or more redistribution layers. For one embodiment, the FOPLP is coupled a board (e.g., a printed circuit board, etc.) to form a packaged system. The warpage control structures can assist with minimizing or eliminating unwanted warpage without requiring research and experimentation into determining materials that exhibit low chemical shrinkage, that can be cured at low temperatures, and that minimize mismatches between thermo-mechanical properties of the material used to form an FOPLP or packaged system comprising the FOPLP. In this way, one or more embodiments of the warpage control structures described herein can assist with reducing costs associated with semiconductor packaging and/or manufacturing.

Figure 1A:
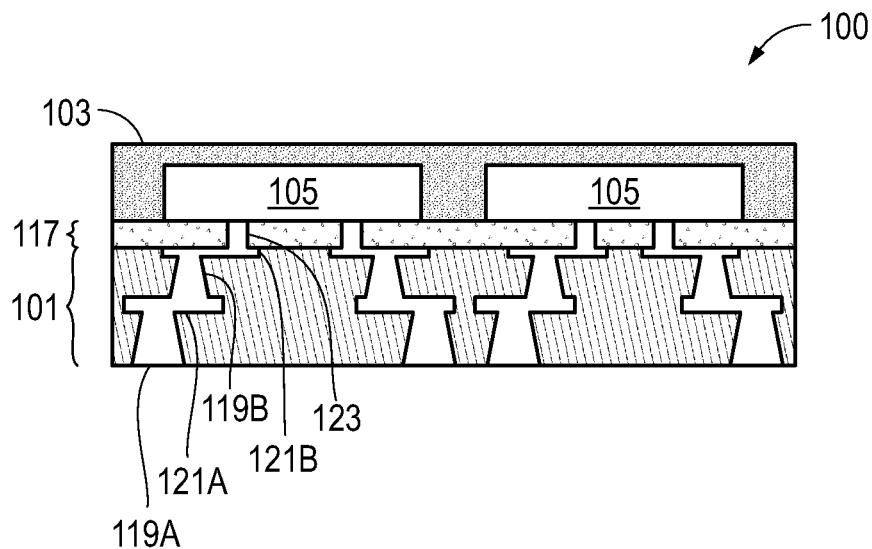
FIG. 1A illustrates a cross-sectional side view of a currently available semiconductor package.

Referring now to FIG. 1A, which illustrates a cross-sectional side view of a currently available semiconductor package 100. As shown, the semiconductor package 100 includes multiple semiconductor dies 105, a dielectric layer 117, a package substrate 101, and a mold compound 103. The semiconductor package 100 may be formed according to a currently available FOPLP technology. Any number of dies 105 may be included in the semiconductor package 100.

As shown in FIG. 1A, the semiconductor package 100 includes multiple semiconductor dies 105 on a dielectric layer 117. At least one of the dies 105 may include one or more features formed therein or thereon. Examples of features include, but are not limited to, active electronic devices (e.g., transistors, rectifiers, any other active electronic device known in the art, any combination thereof, etc.), passive electronic devices (e.g., resistors, capacitors, inductors, transformers, diodes, any other passive electronic device known in the art, any combination thereof, etc.), and isolation structures. As used herein, an "isolation structure" comprises a first feature used to isolate a second feature and a third feature that are adjacent to each other. An isolation structure can minimize or prevent electric current leakage and/or latch-up between the two other adjacent features. Examples of isolation structures include, but are not limited to, a trench (e.g., a three dimensional (3D) trench, a two dimensional (2D) trench, a shallow trench, a deep trench, any other trench known in the art, etc.) and a locally oxidized silicon structure formed using a local oxidation of silicon (LOCOS) technique.

The dielectric layer 117 includes at least one interconnect 123 formed therein or thereon for coupling (e.g., electrical coupling, optical coupling, etc.) the semiconductor dies 105 to each other or to other features formed in or on the package substrate 101. An interconnect enables signal communication between two or more dies, two or more features, or a specific die and a feature that is not formed in or on the specific die. Examples of interconnects include, but are not limited to, conductive lines (which may also be referred to as traces herein), vertical interconnect accesses (vias), pads, conductive structures (e.g., conductive pillars, conductive bumps, etc.), and any combination thereof. For example, and as shown in FIG. 1A, the dielectric layer 117 includes at least one via 123. The dielectric layer 117 can be formed from any suitable dielectric material or combination of dielectric materials. Dielectric materials may be formed from any suitable electrically insulative material. Dielectric materials include, but are not limited to, Ajinomoto Build-up Film (ABF), liquid crystal polymer, benzocyclobutene (BCB), polyimide, prepreg (a weaved fiber network "pre-impregnated" into an epoxy matrix), epoxy, epoxy laminate material (e.g., FR4, G10, G11, FR4, FR5, FR6, etc.), or any combination thereof.

The dielectric layer 117 is on a package substrate 101, which itself comprises one or more layers. For example, the dielectric layer may be laminated on the package substrate 101. Examples of layers include, but are not limited to, one or more of: (i) a metal layer; (ii) a dielectric layer; (iii) a resist layer; (iv) any other layer known in the art of semiconductor packaging, the art of semiconductor fabrication ("the art"); and (iv) a combination thereof. At least one of the layers comprises one or more interconnects formed therein. For example, and as shown in FIG. 1A, the package substrate 101 includes vias 119A-B and pads 121A-B.

As shown, a mold compound 103 encapsulates the multiple semiconductor dies 105. The mold compound can be in film form, liquid form, paste form, or any other suitable form known in the art. For a specific embodiment, the mold compound may be a photo-imaged film. As used herein, "encapsulating" does not require all surfaces to be encased within a mold compound. For example, and as illustrated in FIG. 1, lateral and top sides of the dies 105 are encased in the mold compound 103. Other embodiments, however, are not so limited. For example, the lateral sides of the dies 105 can be encased in the mold compound 103, while the mold compound 103 is not formed over the top surfaces of the dies 105. For some embodiments, the height of the mold compound 103 may contribute to the overall z-height of the semiconductor package 100. Accordingly, and for some embodiments, an amount of mold compound 103 is controlled to achieve a specified height (e.g., a z-height, etc.). Controlling an amount of mold compound 103 to achieve a specified height (e.g., a z-height, etc.) can be performed using any suitable technique (e.g., mechanical planarization, chemical planarization, selective deposition, etc.). Alternatively, an amount of the mold compound 110 can be removed after application in order to achieve a specified height (e.g., a z-height, etc.) or expose one or more sides of the dies 105. Any suitable removal technique (e.g., etching, laser ablation, etc.) may be used. Furthermore, additional processing operations may be subsequently performed in order to provide chemical and mechanical protection to the dies 108 and/or the mold compound 103. The mold compound 103 can be formed from any suitable material or combination of materials used to form mold compounds known in the art.

Figure 1B:
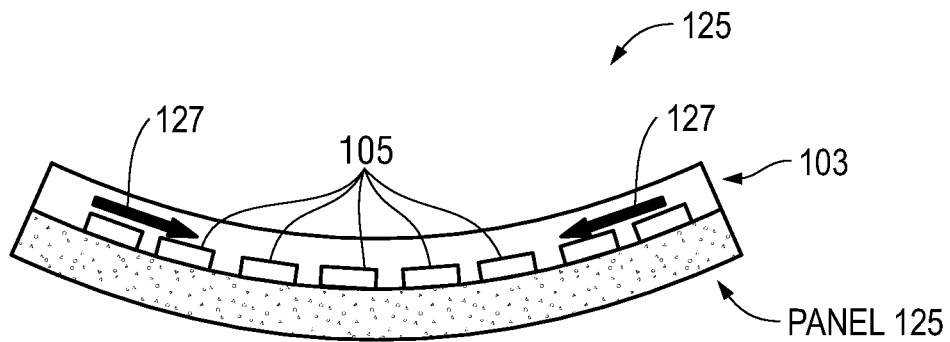
FIG. 1B illustrates a cross-sectional side view of a panel level stack formed in accordance with one or more currently available FOPLP technologies.

Referring now to FIG. 1B, which illustrates a cross-sectional side view of a panel level stack 125 formed in accordance with one or more currently available FOPLP technologies. The semiconductor package 100 described above in connection with FIG. 1A can be formed after the panel level stack 125 shown in FIG. 1B is singulated in to several semiconductor packages. The panel level stack 125 includes components or elements that are similar to or the same as the components or elements described above in connection with the semiconductor package 100 shown in FIG. 1A. For brevity, only differences between the panel level stack 125 shown in FIG. 1B and the semiconductor package 100 shown in FIG. 1A are described below in connection with FIG. 1B.

As shown in FIG. 1B, the mold compound 103 used to encapsulated the multiple semiconductor dies 105 can assist with creating unwanted warpage 127. For example, the warpage 127 can be due to chemical shrinkage of the mold compound 103 during or after curing of the mold compound 103. For another example, warpage 127 can be due to mismatches between thermo-mechanical properties of the mold compound 103 and/or the panel 125.

Figure 2A:
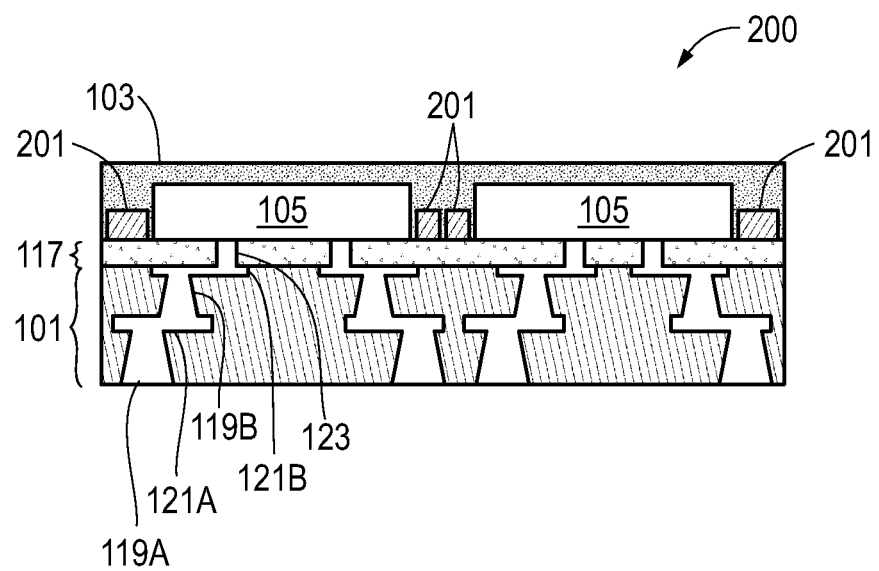
FIG. 2A illustrates a cross-sectional side view of a semiconductor package in accordance with one embodiment.

Referring now to FIG. 2A, which illustrates a cross-sectional side view of a semiconductor package 200 in accordance with one embodiment. The semiconductor package 200 is formed in accordance with one or more embodiments of a FOPLP technology as described herein. The semiconductor package 200 shown in FIG. 2A includes components or elements that are similar to or the same as the components or elements described above in connection with the semiconductor package 100 shown in FIG. 1A. For brevity, only differences between the semiconductor packages 100 and 200 are described below in connection with FIG. 2A.

One difference between the semiconductor packages 100 and 200 is that one or more warpage control structures 201 are included in the semiconductor package 200, while no such structures are included in the semiconductor package 100. For one embodiment, the warpage control structures 201 are adjacently located next to the semiconductor dies 105. For example, a warpage control structure 201 is adjacently located next to one of the semiconductor dies 105. For another example, a warpage control structure 201 is adjacently located between two or more of the semiconductor dies 105. For one embodiment, the warpage control structure(s) 201 are formed from a suitable material (e.g., copper, any other suitable metal, any other combination of suitable metals, any other suitable non-metallic material, any other combination of suitable non-metallic materials, etc.). For a specific embodiment, the warpage control structure(s) 201 are formed from copper or an alloy comprising copper. Furthermore, and for one embodiment, at least one of the warpage control structures 201 may be a pillar, a bump, or any other three-dimensional structure. The warpage control structure(s) 201 can assist with reducing warpage that may affect the semiconductor package 200, as described in further detail below in connection with FIG. 2B. The warpage control structure(s) 201 may or may not be co-planar with one or more of the semiconductor dies 105. The warpage control structure(s) 201 may or may not be co-planar with the mold compound 103.

Figure 2B:
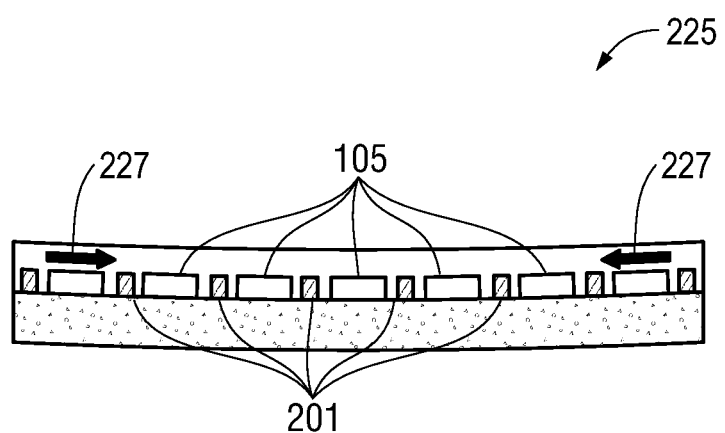
FIG. 2B illustrates a cross-sectional side view illustration of a panel level stack formed in accordance with one or more embodiments of FOPLP technologies.

Referring now to FIG. 2B, which illustrates a cross-sectional side view illustration of a panel level stack 225 formed in accordance with one or more embodiments of FOPLP technologies, as described herein. The semiconductor package 200 described above in connection with FIG. 2A can be formed after the panel level stack 225 shown in FIG. 2B is singulated in to several semiconductor packages. The panel level stack 225 shown in FIG. 2B includes components or elements that are similar to or the same as the components or elements described above in connection with the semiconductor package 200 shown in FIG. 2A. For brevity, only differences between the panel level stack 225 shown in FIG. 2B and the panel level stack 125 shown in FIG. 1B are described below in connection with FIG. 2B.

As shown in FIG. 2B, the mold compound 103 used to encapsulated the multiple semiconductor dies 105 can assist with creating unwanted warpage 227. For example, the warpage 227 can be due to chemical shrinkage of the mold compound 103 during or after curing of the mold compound 103. For another example, warpage 227 can be due to mismatches between thermo-mechanical properties of the mold compound 103 and/or the panel 125. One difference between the panel level stack 225 of FIG. 2B and the panel level stack 125 of FIG. 1B is that the presence of the warpage control structure(s) 201 can assist with reducing warpage. For example, a comparison of the panel level stack 225 of FIG. 2B and the panel level stack 125 of FIG. 1B shows that an amount of the warpage 127 is less than an amount of the warpage 227. This reduction in warpage is advantageous because it can assist with increasing the yield (e.g., number, etc.) of semiconductor packages singulated from the panel level stack 225 of FIG. 2B when compared to the yield (e.g., number, etc.) of semiconductor packages singulated the panel level stack 125 of FIG. 1B. In this way, costs associated with semiconductor manufacturing and packaging can be reduced.

Referring now to FIGS. 3A-3I, cross-sectional side view illustrations are provided to illustrate a method of forming a FOPLP comprising warpage control structures in accordance with an embodiment. The method shown in FIGS. 3A-3I omits one or more components and/or structures known in the art for simplicity and to avoid obscuring and/or convoluting one or more of the inventive concepts described herein.

Figure 3A:
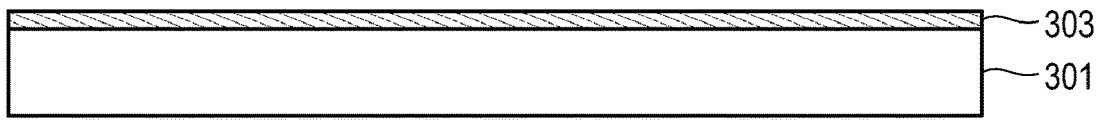
FIGS. 3A-3I are cross-sectional side view illustrations of a method of forming a FOPLP comprising warpage control structures in accordance with an embodiment.
Figure 3B:
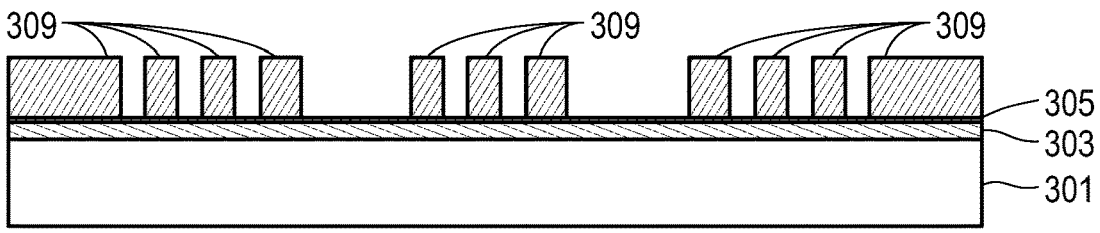

Referring to FIG. 3A, the method of forming a FOPLP can begin with a carrier substrate 301. The substrate 301 can, for example, be a silicon wafer, a glass wafer, a metal carrier, a copper clad laminate (CCL), etc. Moving on to FIG. 3B, an adhesive layer 303 is applied on the carrier substrate 301. For example, the adhesive layer 303 is a temporary adhesive, e.g., a polyimide adhesive, a polymeric bonding agent, adhesive tapes, etc. Also, and as shown in FIG. 3B, a seed layer 305 is deposited on the adhesive layer 303. The seed layer 305 can be formed from a material (e.g., copper, etc.) or a combination of suitable materials used to form a seed layer. The seed layer 305 can be deposited via any suitable deposition technique, e.g., an electroless plating, sputtering, chemical vapor deposition (CVD), metalorganic chemical vapor deposition (MOCVD), atomic layer deposition (ALD), any other suitable technique of depositing, applying, growing, or plating seed layers, or a combination thereof. Furthermore, and as shown in FIG. 3B, a resist layer is deposited on the seed layer 305 and patterned using one or more lithography techniques to form a patterned resist layer 309. As shown, the patterned resist layer 309 includes openings.

Figure 3C:
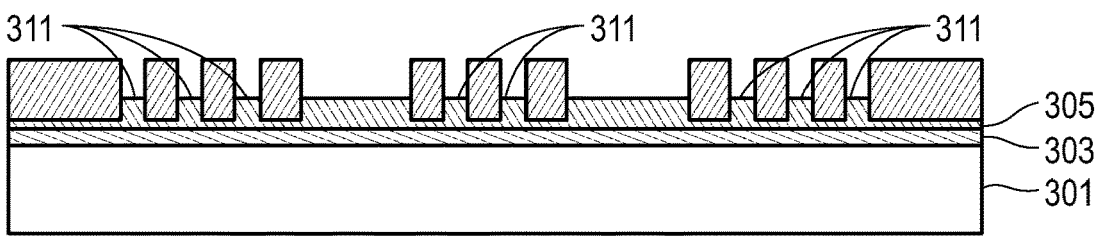

Next, in FIG. 3C, one or more layers 311 formed from a metallic material (e.g., copper, any other conductive metal, any combination of conductive metals, etc.) are deposited, applied, plated, or grown in the openings of the patterned resist layer 309. For one embodiment, a plating operation is used to plate the metal layer(s) 311 on or onto the top surfaces of the seed layer 112 in the openings of the patterned resist layer 309. Accordingly, the openings of the patterned resist layer 309 are filled (at least partially) with one or more metal layers. For one embodiment, the metals layer(s) 311 are controlled to achieve a specified z-height and/or weight.

Figure 3D:
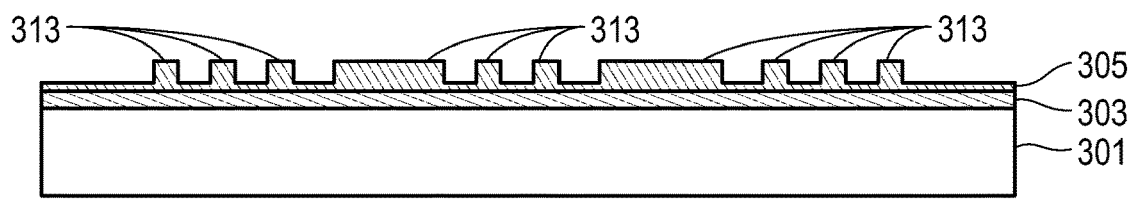

With regard now to FIG. 3D, any remaining portion of the patterned resist layer 309 may be removed to uncover or reveal one or more portions of the seed layer 305. For one embodiment, none of the metal layer(s) 311 are on the uncovered portion(s) of the seed layer 305. This removal operation is performed after deposition of the metal layer(s) 311. The patterned resist layer 309 may be removed or stripped by conventional techniques, such as by use of one or more resist stripping techniques known in the art, any other suitable technique used for removing resist layers known in the art, or any combination of suitable techniques used for removing resist layers known in the art. As used herein, "an uncovered portion of a layer" and its variations mean that a top surface of the uncovered portion is revealed because no component or layer is on the uncovered portion. As used herein, "a covered portion of a layer" and its variations mean that a top surface of the covered portion is not revealed because one or more components or layers are on the uncovered portion. Side surfaces of a covered portion of a layer may or may not be covered by any component, layer, feature, or material.

Following removal of the patterned resist layer 309, a plurality of warpage control structures 313 are formed. As explained above, the metals layer(s) 311 may be controlled to achieve a specified z-height. In this way, at least one of the plurality of warpage control structures 313 may be fabricated to have a specified z-height.

Figure 3E:
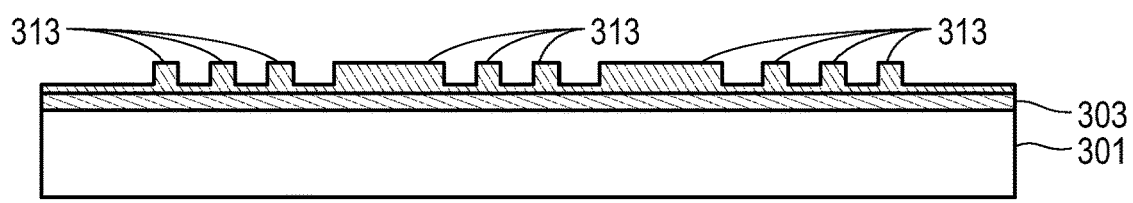

Next, in FIG. 3E, the uncovered top portion(s) of the seed layer 305 may be removed to uncover or reveal one or more top portions of the adhesive layer. Any suitable removal or etching technique may be used.

Figure 3F:
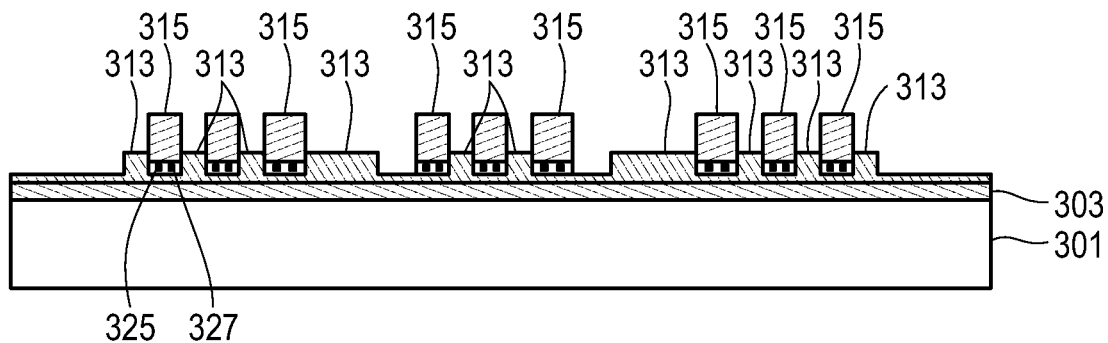

Moving on to FIG. 3F, semiconductor dies 315 are mounted on the adhesive layer 303 in openings between the warpage control structures 313. The plurality of dies 315 may be transferred to the adhesive layer 303 using a suitable technique such as a pick and place machine. As shown, in FIG. 3F, each of the semiconductor dies 315 includes a passivation layer 323 and exposed contact pads 325. For one embodiment, top sides of the dies 315 may be co-planar with top sides of the warpage control structures 313. For another embodiment, top sides of the dies 315 are not co-planar with top sides of the warpage control structures 313. For example, the dies 315 may have a z-height that is greater than or less than a z-height of the warpage control structures 313.

Figure 3G:
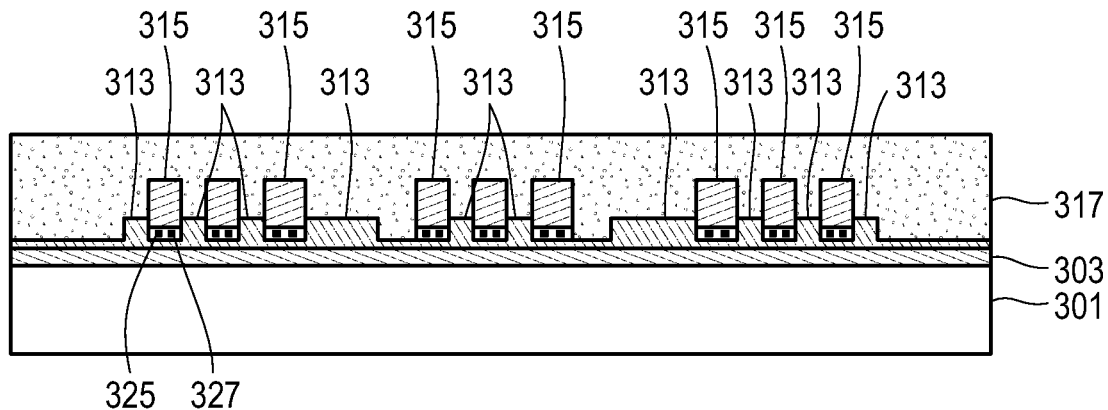
Figure 3H:
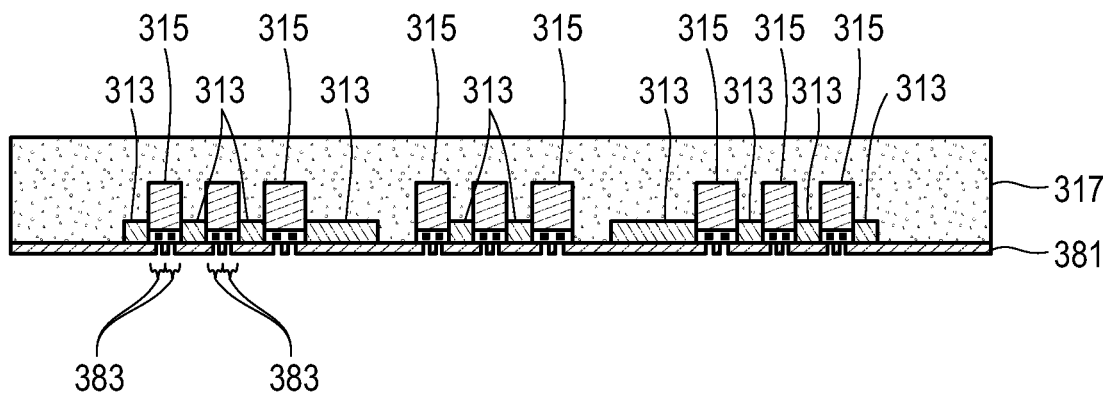

Referring now to FIG. 3G, the semiconductor dies 315 and the warpage control structures 313 are encapsulated in a mold compound 317 on the adhesive layer 303. As explained above, encapsulating does not require all sides of the semiconductor dies 315 and/or the warpage control structures 313 to be encapsulated. Furthermore, an amount of the mold compound 317 may be controlled or removed to achieve a specified z-height and/or weight. Additionally, planarization or any suitable removal technique (e.g., etching, stripping, etc.) may be used to achieve a specified z-height of the mold compound 317. For one embodiment, top sides of two or more of the dies 315, the mold compound 317, and the warpage control structures 313 may be co-planar with each other. For another embodiment, top sides of two or more of the dies 315, the mold compound 317, and the warpage control structures 313 may not be co-planar with each other. For example, the mold compound 317 may have a z-height that is equal to, greater than, or less than a z-height of the warpage control structures 313 and/or a z-height of the dies 315.

Figure 3I:
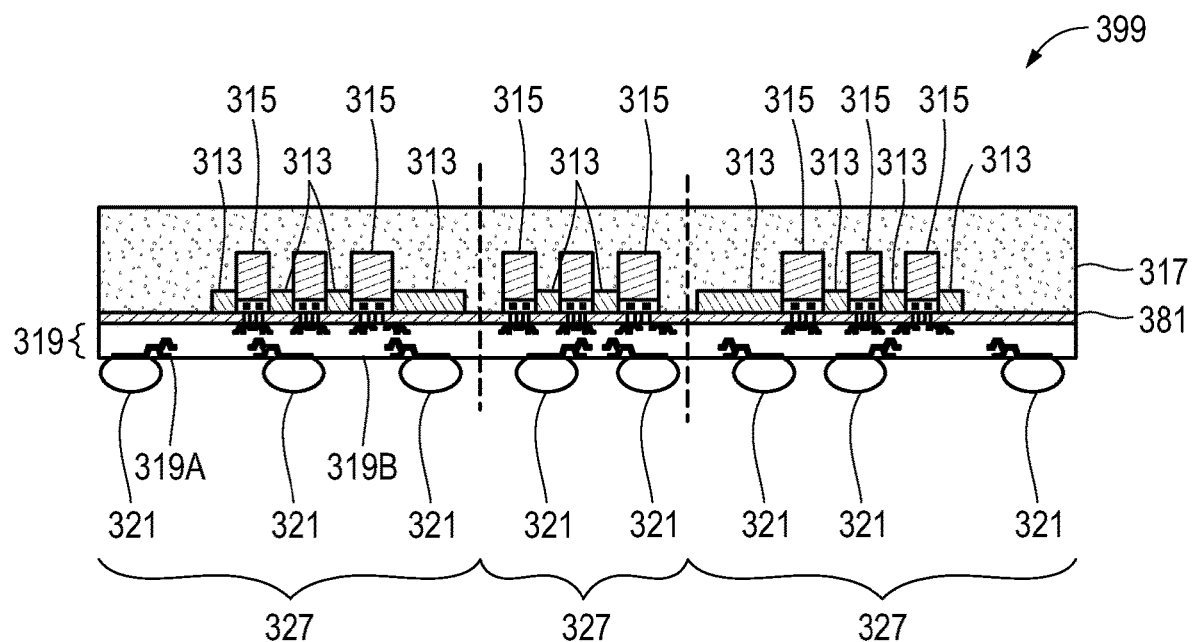

Moving on FIG. 3I, the temporary adhesive layer 303 and carrier substrate 301 may be removed after application of the mold compound 317, which results in a plurality of embedded dies 315 with exposed contact pads 325. Furthermore, and as shown in FIG. 3I, an insulating layer 381 (e.g., a dielectric layer, etc.) may be deposited (e.g., laminated, etc.) on bottom sides of the semiconductor dies 315 (having contact pads 325), the warpage control structures 313, and the mold compound 317. The insulating layer 381 can be processed (e.g., using laser drilling techniques, any other suitable techniques, etc.) to create interconnects 383 (e.g., vias, pads, etc.) under the contact pads 325.

Referring again to FIG. 3I, one or more redistribution layers 319 may be formed on a bottom side of the insulating layer 381 having the interconnects 383 (e.g., vias, pads, etc.) under the contact pads 325. For example, three redistribution layers 319 are formed on a bottom side of the insulating layer 381.

For one embodiment, the redistribution layer(s) 319 include one or more interconnects 319A and passivation layers 319B. The material of interconnects 319A can be formed from a metallic material such as: copper (Cu); titanium (Ti); nickel (Ni); gold (Au); a combination of at least one of Ti, Ni, Au, or Cu; or other suitable metals, alloys, or combinations of metals and/or alloys. A passivation layer can be formed from any suitable insulating materials such as an oxide, or polymer (e.g. polyimide). For an embodiment, an interconnect 319A of the redistribution layer(s) 319 is formed on the contact pads 106 (e.g., directly on the contact pads, etc.) using a suitable technique such as sputtering, followed by etching to form the interconnect 319A. One or more of the redistribution layers 319, which include multiple interconnects 319A and passivation layers 319B, can be formed using a sequence of deposition and patterning resulting in the structure illustrated in FIG. 3I.

With regard again to FIG. 3I, a panel level stack 399 comprising multiple FOPLPs 327 is formed. As shown in FIG. 3I, each of the FOPLPs 327 includes one or more warpage control structures 313. Furthermore, and as shown in FIG. 3I, conductive bumps 321 (e.g., solder balls, etc.) may be formed on a bottom side of the redistribution layer(s) 319, followed by singulating the panel level stack 399 along the dotted lines to obtain individual FOPLPs 327 in accordance with an embodiment. For one embodiment, at least one of the FOPLPs 327 is similar to or the same as the semiconductor package 200 described above in connection with FIG. 2A. For one embodiment, the panel level stack 399 is similar to or the same as the panel level stack 225 described above in connection with FIG. 2B.

Figure 4:
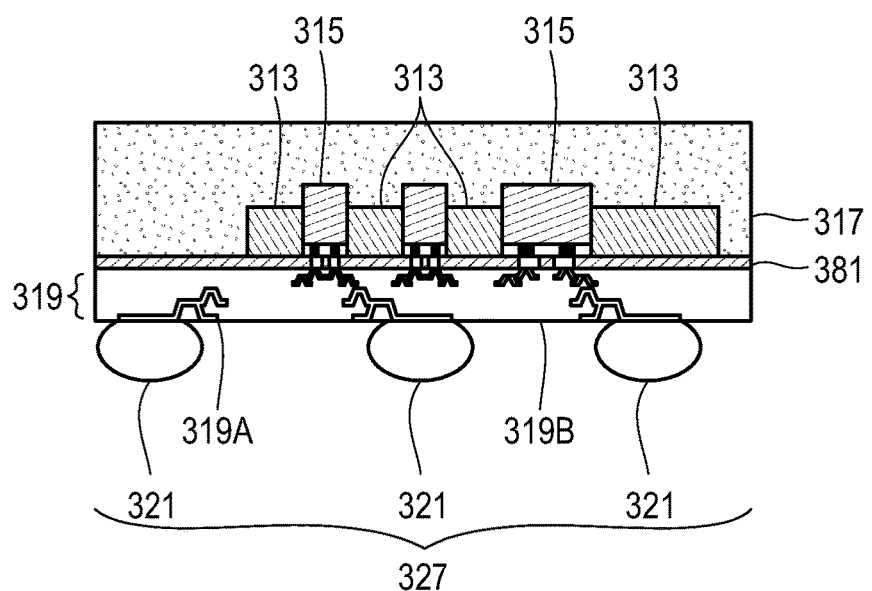
FIG. 4 illustrates one of the singulated FOPLPs formed in accordance with the method of FIGS. 3A-3I.

FIG. 4 illustrates one of the singulated FOPLPs 327 described above in connection with FIGS. 3A-3I. Additional operations may be performed to include the FOPLP 327 in a packaged system. An exemplary packaged system is described below in connection with one or more of the following Figures.

FIGS. 5A-5M illustrate cross-sectional side views showing a method of forming an FOPLP comprising warpage control structures in accordance with an embodiment. The method shown in FIGS. 5A-5M omits one or more components and/or structures known in the art for simplicity and to avoid obscuring and/or convoluting one or more of the inventive concepts described herein. Furthermore, the method shown in FIGS. 5A-5M may include some operations that are similar to or the same as the operations described above in connection with FIGS. 3A-3I. For brevity, these similar/same operations are described in detail below in connection with FIGS. 5A-5M, unless such description is necessary to avoid obscuring the inventive concepts described herein.

The method show in FIGS. 5A-5M is based on a semiadditive process (SAP). An SAP is contrasted from subtractive and additive processes.

A subtractive process begins with a metal layer formed from a metallic material (e.g., copper, etc.) on one or more other layers of a package substrate or on a carrier substrate (e.g., an adhesive layer, an insulating layer, any other suitable layer, etc.). The metal layer can be deposited using any suitable deposition technique (e.g., plating, ALD, etc.). Next, through-holes may be formed in the metal layer, the other layer(s), and the package/carrier substrate. A protective mask (e.g., a mask formed from an etch-resistant material, etc.) comprising a desired pattern of metallic structures is applied on the metal layer. The pattern of metallic structures, can for example, include interconnects (e.g., a circuit comprising vias, conductive lines, traces, pads, bumps, pillars, etc.). Next, any portion of the metal layer that is not protected by the protective mask is removed via any suitable removal technique or combination of removal techniques. The protective mask may then be removed via suitable techniques. In this way, the subtractive process requires removing some of the metallic material from the metal layer to create a desired metallic pattern comprising one or more metallic structures (e.g., a circuit, etc.).

In contrast to the subtractive process, an additive process begins with one or more non-metal layers of a package substrate or on a carrier substrate (e.g., an adhesive layer, an insulating layer (which may also be referred to herein as a dielectric layer), a resist layer, any other suitable layer, etc.). One example of an additive process includes applying a dielectric layer (e.g., a laminate film, an ABF, etc.) on a package or carrier substrate. A protective material (e.g., an etch-resistant material, etc.) comprising a desired pattern of areas where metallic structures will not be formed is applied on the dielectric layer. Next, metallic materials are deposited in any portion of the dielectric layer that is not protected by the protective mask. Subsequently, the protective mask is removed via any suitable removal technique or combination of removal techniques. In this way, the additive process requires adding metallic material onto the dielectric layer to create a desired metallic pattern comprising one or more metallic structures (e.g., a circuit, etc.). One advantage of the additive process over the subtractive process is that less metallic material is needed to form the desired metallic pattern, which in turn assist with minimizing waste.

SAPs are becoming increasingly prevalent because they can be used in multi-layer package substrates to facilitate deposition of metallic material for forming vias. One example of an SAP is described below in connection with FIGS. 5A-5M.

Figure 5A:
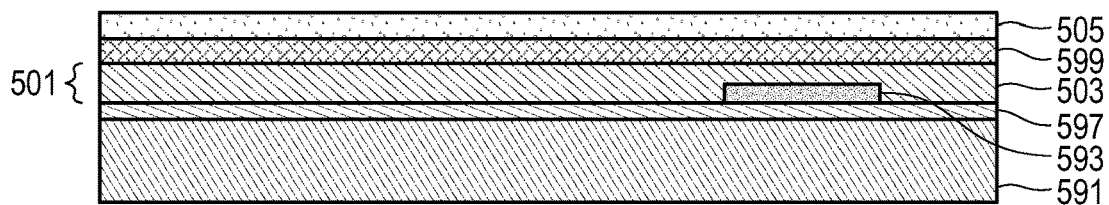
FIGS. 5A-5M illustrate cross-sectional side views showing a method of forming an FOPLP comprising warpage control structures in accordance with an embodiment.

With regard now to FIG. 5A, a package substrate 501 is provided. The package substrate 501 can comprise one or more layers (e.g., a metal layer, a dielectric layer 503, etc.), interconnects, and/or other features or components therein. For example, and as shown in FIG. 5A, the package substrate 501 includes a pad 593 formed therein.

The package substrate 501 is on a carrier substrate 591, which can be a blank core or depanel substrate. The carrier substrate 591 can be similar to or the same as the carrier substrate 101 described above in connection with FIGS. 3A-3I. For one embodiment, an adhesive layer 597 attaches the carrier substrate 591 to the package substrate 501. More specifically, and for this embodiment, the adhesive layer 597 attaches the carrier substrate 591 to an insulating layer 503 of the package substrate 501. Additional details about the insulating layer 503 are described below. The adhesive layer 597 may be formed from any suitable adhesive known in the art. The adhesive layer 597 can be in film form, liquid form, paste form, any other suitable form known in the art, or any combination thereof. For one embodiment, the adhesive layer 597 is similar to or the same as the adhesive layer 303 described above in connection with FIGS. 3A-3I.

The package substrate 501 may be formed from any suitable materials known in the art (e.g., metal, metal alloys, silicon, epoxy resins, organic materials, inorganic materials, any combination thereof, etc.). The package substrate 501 may comprise a semiconductor substrate. The semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the package substrate 501 and/or the carrier substrate 591 on which the package substrate 501 resides may be formed as described herein, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of embodiments described herein.

For one embodiment, the package substrate 501 comprises an organic substrate. For one embodiment, the package substrate 501 comprises an epoxy dielectric material (e.g., an Ajinomoto Build-up Film (ABF), any other suitable epoxy dielectric material, etc.), liquid crystal polymer, benzocyclobutene (BCB), polyimide, prepreg (a weaved fiber network "preimpregnated" into an epoxy matrix), epoxy, or any combination thereof. For one embodiment, the package substrate 501 comprises inorganic fillers, such as silica. For one embodiment, the package substrate 501 is a multi-chip package substrate. For one embodiment, the package substrate 501 is a System-in-Package (SiP) substrate. For another embodiment, package substrate 501 is an interposer substrate.

For one embodiment, the package substrate 501 includes metal layers comprising conductive lines, pads, and/or electronic devices for integrated circuits (ICs). Examples of these electronic devices include, but are not limited to, transistors, memories, capacitors, inductors, resistors, optoelectronic devices, switches, and any other active and passive electronic devices that are separated by an insulating layer, for example, an interlayer dielectric, a trench insulation layer, or any other insulating layer known in the art of the semiconductor manufacturing and/or packaging. For one or more embodiments, the package substrate 501 includes interconnects, for example, vias, configured to connect the metal layers.

With regard again to FIG. 5A, for some embodiments, the package substrate 501 may comprise multiple layers, as described below in connection with one or more of the following Figures. Example of these layers include, but are not limited to, one or more of: (i) at least one insulating layer; (ii) at least one metal layer; and (iii) one or more other layers known in the art (e.g., resist layer, passivation layer, protection layer, etc.).

The package substrate 501 may be manufactured using SAP technology. For one embodiment, the SAP process flow used for the package substrate 501 includes depositing an insulating layer 503. The insulating layer may comprise any suitable material such as, for example, a polymer. One example of a suitable material for the insulating layer 503 is an epoxy dielectric material (e.g., an ABF, any other suitable epoxy dielectric material, etc.). The insulating layer 503 can be deposited using one or more suitable dielectric deposition techniques known to one of ordinary skill in the art. For example, the insulating layer 503 can be deposited via one or more lamination techniques known in the art. For one embodiment, the SAP process flow used for the package substrate 501 includes processing the insulating layer 503 using one or more surface roughening techniques known in the art. For one embodiment, the insulating layer 503 is laminated in the package substrate 501 such that one or more layers and/or features in the package substrate 501 (e.g., metal layer(s), interconnects, etc.) are electrically isolated from subsequent layers and/or features formed on the insulating layer 503. For one embodiment, the insulating layer 503 has a thickness (e.g., a z-height, etc.) that is less than or equal to 100 micrometers (μm or microns). For one embodiment, the insulating layer 503 has a thickness (e.g., a z-height, etc.) that is greater than or equal to 10 μm.

Referring again to FIG. 5A, the SAP process flow can include depositing (e.g., laminating, etc.) a primer layer 599 on the insulating layer 503. The primer layer 599 can be formed from any suitable dielectric material. For one embodiment, the primer layer 599 is processed using a suitable surface roughening technique known in the art. This technique can include a process of abrading a top surface of primer layer 599 (mechanically, chemically, or both) to improve the adhesion of the package substrate 591 with subsequently formed layers and features (e.g., metal layer(s), dielectric layers, adhesive layers, interconnects, etc.). For one embodiment, the primer layer 599 has a thickness (e.g., a z-height, etc.) that is less than or equal to five (5) µm. For one embodiment, the primer layer 599 has a thickness (e.g., a z-height, etc.) that is greater than or equal to two (2) µm.

With regard again to FIG. 5A, the SAP process flow can include formation of one or more metal layers on the primer layer 599. For one embodiment, a metal foil 505 is deposited (e.g., plated, etc.) on a top surface of the insulating layer 503. The metal foil 505 can be formed from copper, or any other suitable material or combination of materials used to form foils known in the art. The metal foil 505 can be deposited via any suitable deposition technique, e.g., an electroless plating, sputtering, chemical vapor deposition (CVD), metalorganic chemical vapor deposition (MOCVD), atomic layer deposition (ALD), any other suitable technique of depositing seed layers, or a combination thereof.

Figure 5B:
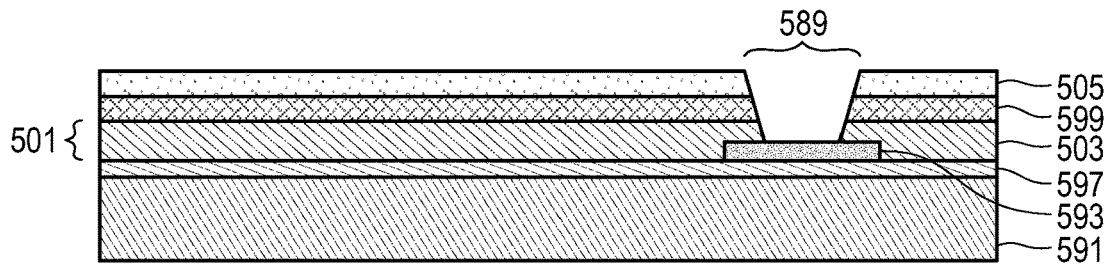

With regard now to FIG. 5B, the metal foil 505, the primer layer 599, and the insulating layer 503 can be processed (e.g., using laser drilling techniques, any other suitable techniques, etc.) to create an opening 589, which reveals a top side of the contact pad 593. Furthermore, and for one embodiment, a desmearing operation may be performed to remove any residue in the opening 589 after its formation.

Figure 5C:
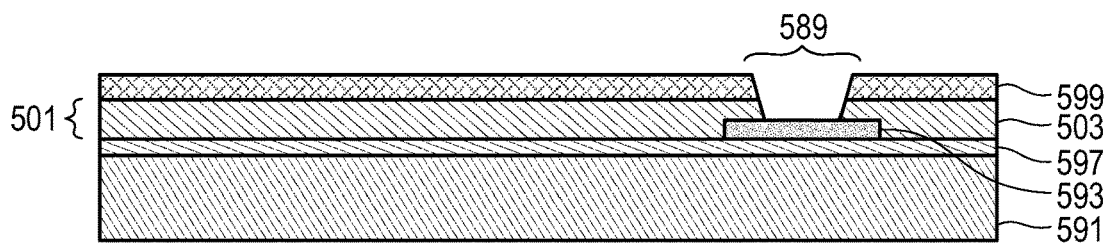

Moving on to FIG. 5C, the metal foil 505 is removed. Any suitable removal technique may be used (e.g., etching, stripping, etc.).

Figure 5D:
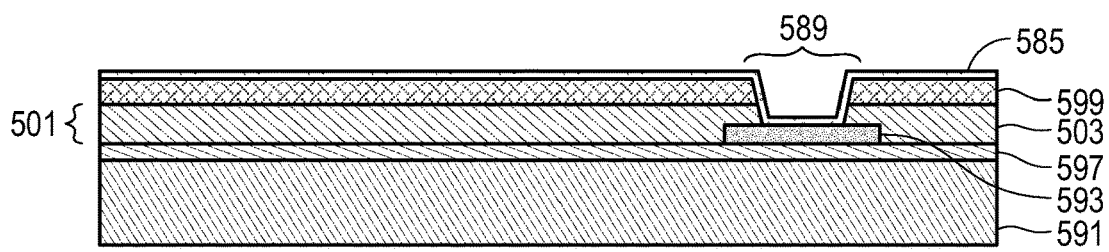

In FIG. 5D, a metallic material 585 is deposited on the primer layer 599 and in the opening 589. Depositing the metallic material 585 in the opening 589 creates a conductive via 587. Any suitable deposition technique or combination of deposition techniques may be used (e.g., electroless plating, etc.).

Figure 5E:
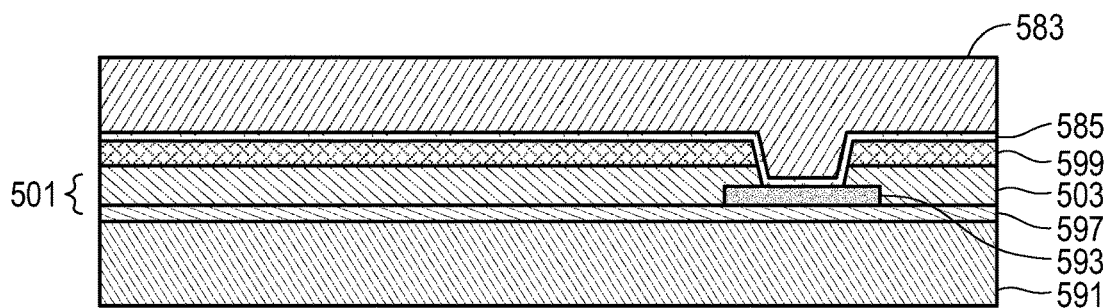

Moving on to FIG. 5E, a resist layer 583 is deposited on the primer layer 599 and in the conductive via 587 after deposition of the metallic material 585. For an embodiment, the resist layer 583 is formed from a light-sensitive material (e.g., resist, photoresist, photoimageable dielectric (PID), any other suitable light-sensitive material known in the art, any combination of suitable light-sensitive materials known in the art, etc.). The light-sensitive material used to form the resist layer 583 can be processed by etching techniques or any other suitable removal technique(s). The light-sensitive material used to form the resist layer 583 may be in film form, paste form, liquid form, any other suitable form, or any combination thereof. The light-sensitive material used to form the resist layer 583 may comprise a positive tone light-sensitive material, a negative tone light-sensitive material, or a combination thereof.

Figure 5F:
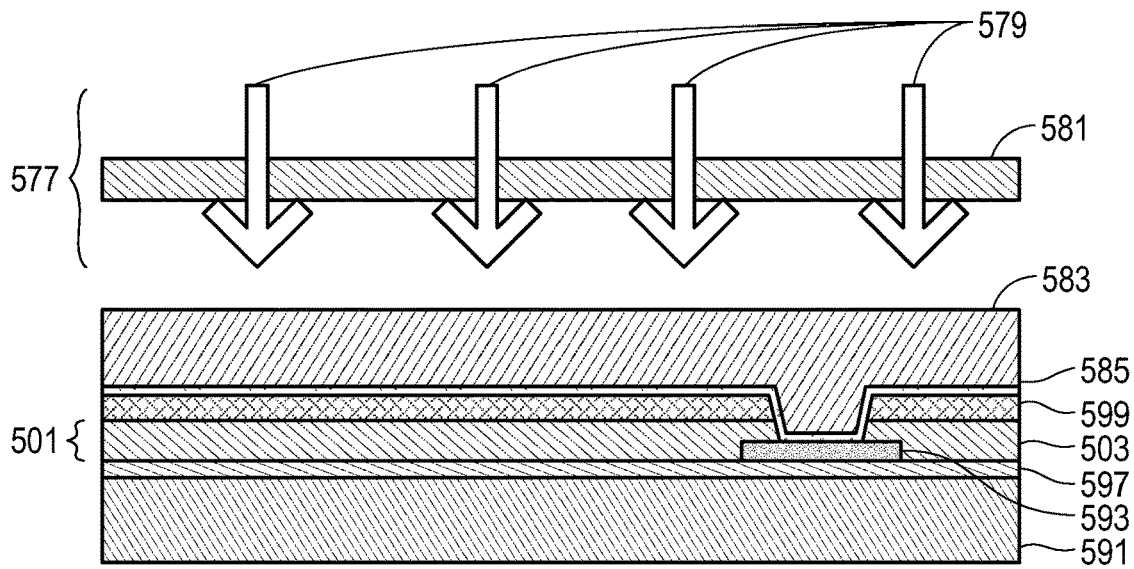

With regard now to FIG. 5F, the resist layer 583 is patterned using one or more lithography techniques 577. For example, and as shown in FIG. 5F, the lithography technique(s) 577 may comprise exposing one or more portions of the resist layer 583 by application of light 579 (e.g., ultra-violet (UV), etc.) passing through a photomask 581 to the resist layer 583. The lithography technique(s) 577 form one or more patterns in the resist layer 583. Any lithography technique or combination of lithography techniques known in the art can be used.

Figure 5G:
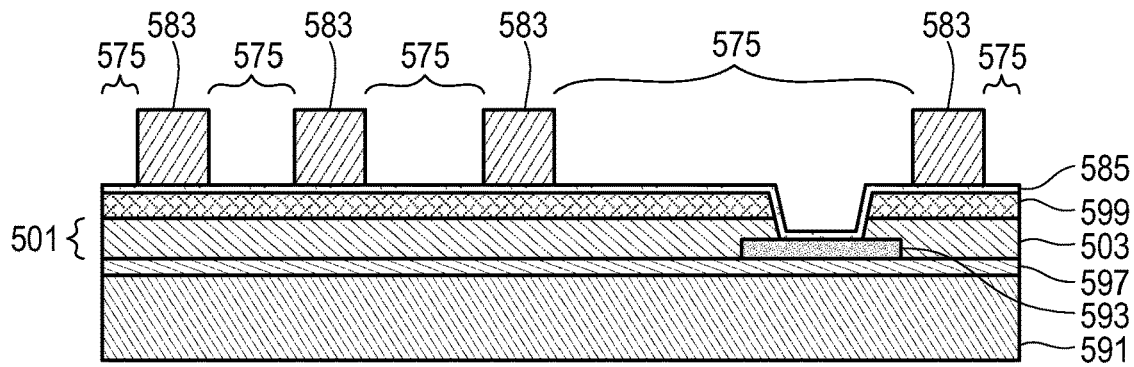

Moving on to FIG. 5G, the exposed resist layer 583 described above may be processed using at least one removal technique, which can, for example, include removing, stripping, etching, or dissolving away the (un)exposed portions of the resist layer 583 to reveal a pattern comprising openings 575. For some embodiments, when the resist layer 583 is formed from a positive tone light-sensitive material, exposed portions of the resist layer 583 are removed by a solvent called a resist developer after they become soluble to the resist developer, while the unexposed portions of the resist layer 583 are not removed because they remain insoluble to the resist developer. For some embodiments, when the resist layer 583 is formed from a negative tone light-sensitive material, unexposed portions of the resist layer 583 are removed by a resist developer after they become soluble to the resist developer, while the exposed portions of the resist layer 583 are not removed because they remain insoluble to the resist developer. The transferred pattern can include, but is not limited to, a pattern for one or more warpage control structures 573. The warpage control structures provide functions and/or advantages that are similar to or the same as the warpages structures described above in connection with FIGS. 2A-3I.

Figure 5H:
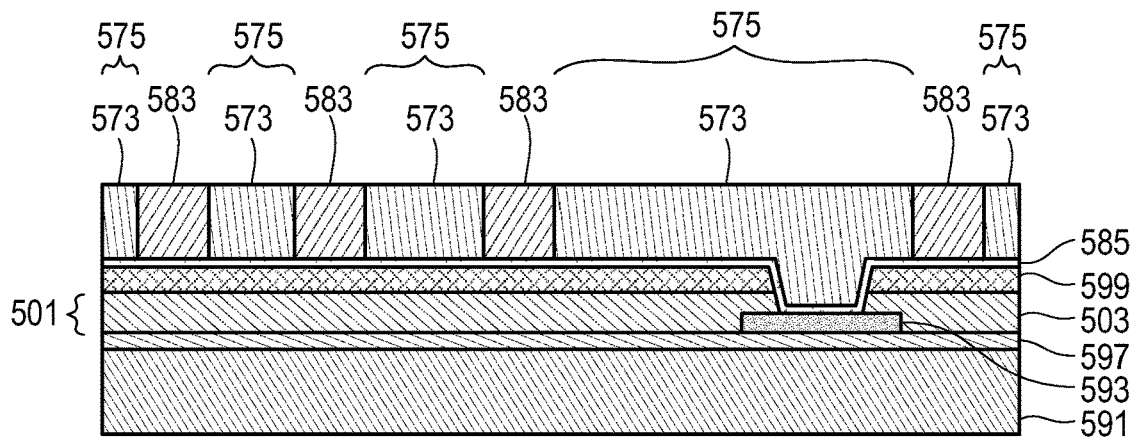

Referring again to FIG. 5H, warpage control structures 573 may be formed in the openings 575 of the patterned resist layer 583. For one or more embodiments, forming warpage control structures 573 may include depositing one or more metallic materials onto surfaces of the metallic material 585 that are not covered by the resist layer 575 so as to fill (at least partially) the openings 575. For one embodiment, forming warpage control structures 573 comprises performing an electrolytic metal plating operation to plate one or more metallic materials onto surfaces of the metallic material 585 that are not covered by the resist layer 575 so as to fill (at least partially) the openings 575. The metallic materials used to fill (at least partially) the openings 575 may be controlled to achieve a specified z-height and/or weight. As shown in FIG. 5H, each warpage control structures 573 is adjacent to one or more pillars of the (un)exposed resist layer 583. Top surfaces of the warpage control structures 573 may or may not be co-planar with top surfaces of the (un)exposed resist layer 583. The one or more metallic materials used to form warpage control structures 573 can be deposited via any suitable deposition technique, e.g., a plating technique, any suitable technique of depositing metal layers, any combination of suitable techniques, etc. The one or more metallic materials used to form warpage control structures 573 can be formed from copper, any suitable metal (e.g., a conductive metal, etc.), any suitable metal alloy (e.g., a conductive metal, etc.), and any combination of suitable metals or metal alloys.

Figure 5I:
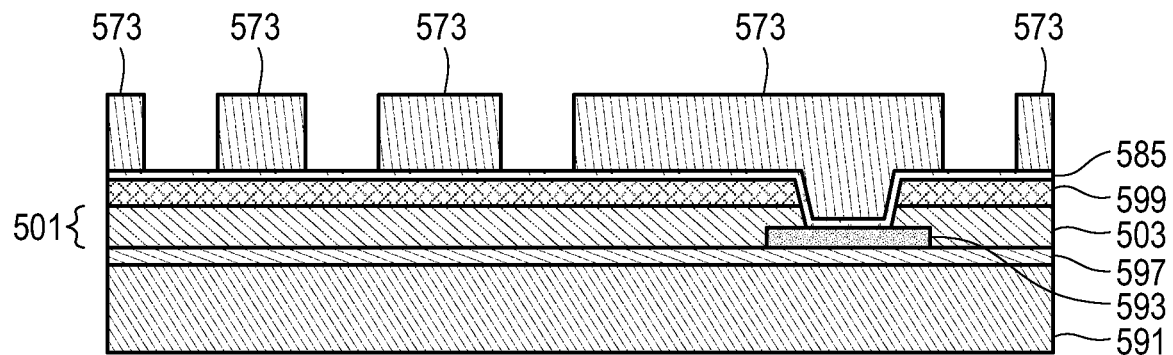

With regard now to FIG. 5I, any remaining portion of the (un)exposed resist layer 583 may be removed to isolate the warpage control structures 573. Additionally, any portion of the seed layer 585 that is not under a warpage control structure 573 is removed. Any suitable removal technique or combination of techniques may be used (e.g., etching, stripping, etc.).

Figure 5J:
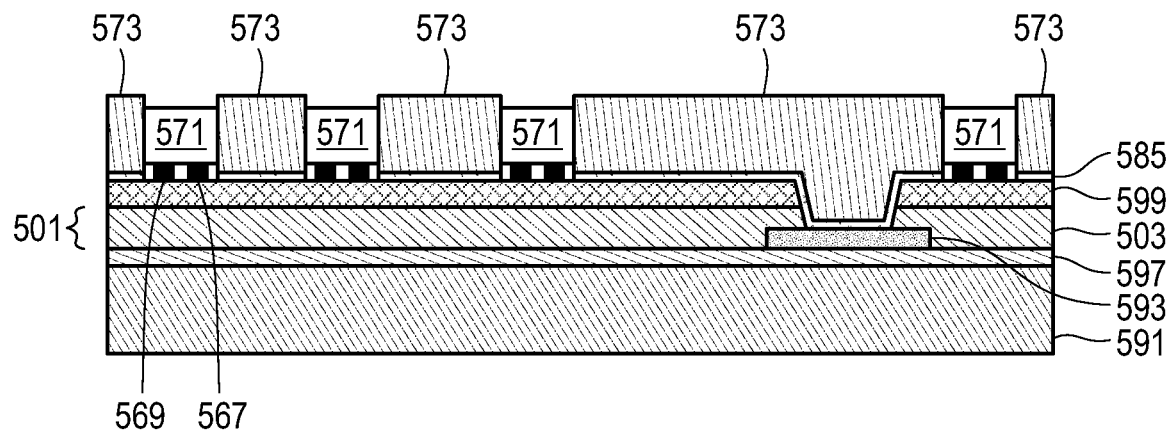

Moving on to FIG. 5J, semiconductor dies 571 are mounted on the primer layer 599 (which may comprise an adhesive layer as its top layer) in openings between the warpage control structures 573. The plurality of dies 571 may be transferred to the primer layer 599 using a suitable technique such as a pick and place machine. As shown, in FIG. 5J, each of the semiconductor dies 571 includes a passivation layer 569 and exposed contact pads 567. For one embodiment, top sides of the dies 571 may or may not be co-planar with top sides of the warpage control structures 573. For example, the dies 571 may have a z-height that is equal to, greater than, or less than a z-height of the warpage control structures 573.

Figure 5K:
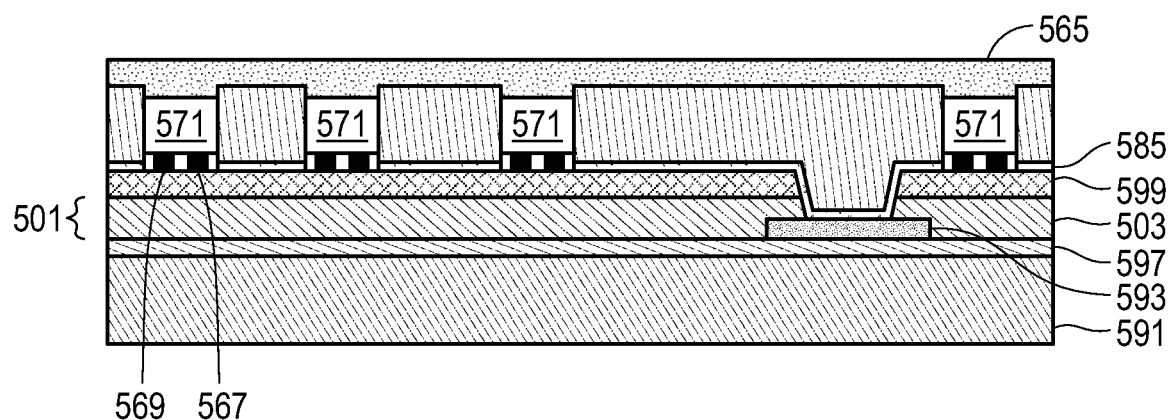

Referring now to FIG. 5K, the semiconductor dies 571 and the warpage control structures 573 are encapsulated in a mold compound 565 on the primer layer 599. As explained above, encapsulating does not require all sides of the semiconductor dies 571 and/or the warpage control structures 573 to be encapsulated. Furthermore, an amount of the mold compound 565 may be controlled or removed to achieve a specified z-height. Additionally, planarization or any suitable removal technique (e.g., etching, stripping, etc.) may be used to achieve a specified z-height of the mold compound 565. For one embodiment, top sides of two or more of the dies 571, the mold compound 565, and the warpage control structures 573 may be co-planar with each other. For another embodiment, top sides of two or more of the dies 571, the mold compound 565, and the warpage control structures 573 may not be co-planar with each other. For example, the mold compound 565 may have a z-height that is equal to, greater than, or less than a z-height of the warpage control structures 573 and/or a z-height of the dies 571.

Figure 5L:
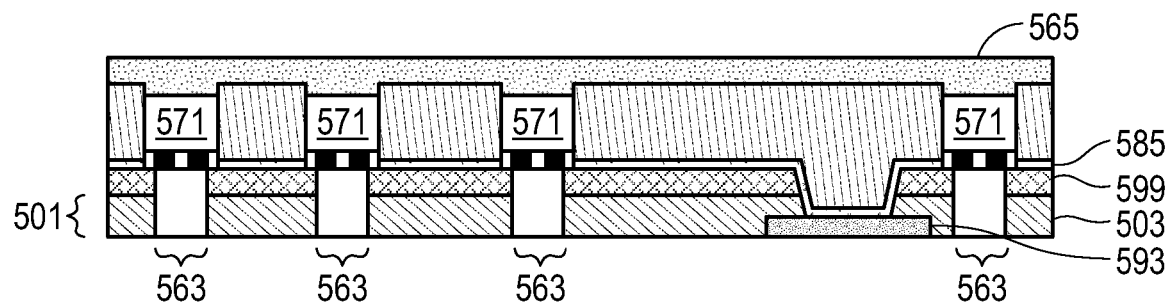

Moving on FIG. 5L, the carrier substrate 591 is separated from package substrate 501 by removing the adhesive layer 597. Separation of the carrier substrate 591 may be performed before, during, or after application of the mold compound 565. For one embodiment, removal of the carrier substrate 591 and the adhesive layer 597 reveals a bottom side of the contact pad 593. For one embodiment, revealing the bottom side of the contact pad 593 allows for attachment of an interconnect architecture after separation of the carrier substrate 591. Examples of interconnect architectures include, but are not limited to, solder bumps, wire bonding, any other suitable interconnect architecture known in the art, or any combination thereof.

Furthermore, and as shown in FIG. 5L, the package substrate 501 and the primer layer 599 can be processed (e.g., using laser drilling techniques, any other suitable techniques, etc.) to create one or more interconnects 563 (e.g., conductive vias, pads, etc.), which results in a plurality of embedded dies 571 with interconnects 563 (e.g., conductive vias, pads, etc.) to contact pads 567.

Figure 5M:
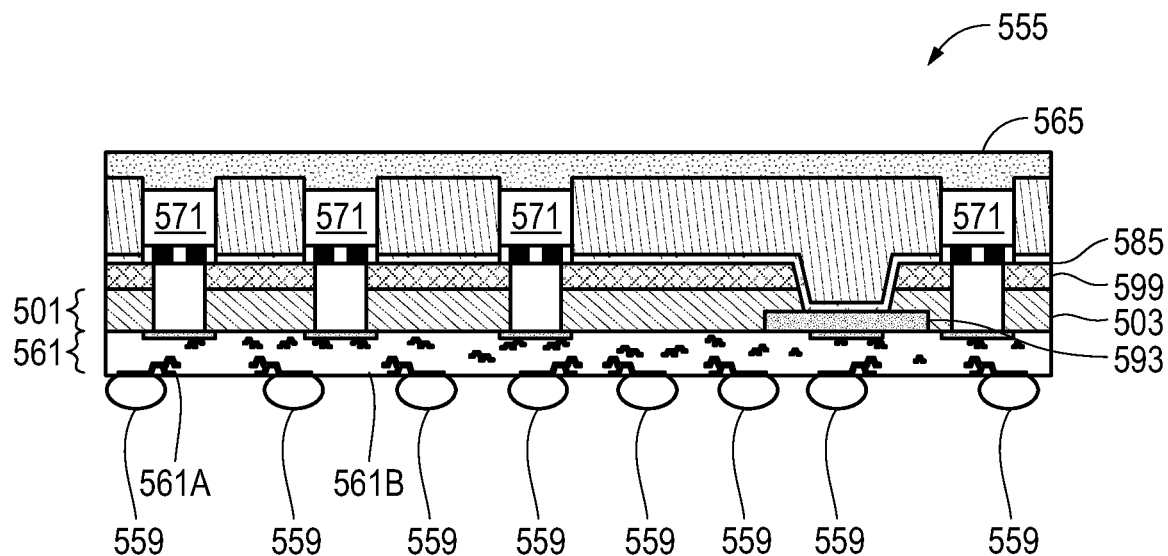

Referring now to FIG. 5M, one or more redistribution layers 561 are formed over bottom sides of the package substrate 501 and primer layer 599 having interconnects 563 under the contact pads 567. For example, three redistribution layers 561 are formed on bottom sides of the package substrate 501 and primer layer 599 having interconnects 563.

For one embodiment, the redistribution layer(s) 561 include one or more interconnects 561A and passivation layers 561B. The material of interconnects 561A can be formed from a metallic material such as: copper (Cu); titanium (Ti); nickel (Ni); gold (Au); a combination of at least one of Ti, Ni, Au, or Cu; or other suitable metals, alloys, or combinations of metals and/or alloys. A passivation layer can be any suitable insulating materials such as an oxide, or polymer (e.g. polyimide). For an embodiment, an interconnect 561A of the redistribution layer(s) 561 is formed on interconnects 563, which are coupled to the contact pads 567, using a suitable technique such as sputtering, followed by etching to form the interconnect 561A. One or more of the redistribution layers 561 including multiple interconnects 561A and passivation layers 561B can be formed using a sequence of deposition and patterning resulting in the structure illustrated in FIG. 5M.

Referring again to FIG. 5M, an FOPLP 555 is formed after the operations described above in connection with FIGS. 5A-5M are performed. The FOPLP 555 includes one or more warpage control structures 573. Furthermore, and as shown in FIG. 5M, conductive bumps 559 (e.g., solder balls, etc.) are formed on a bottom side of the redistribution layer(s) 561. For one embodiment, the FOPLP 555 is similar to or the same as the semiconductor package 200 described above in connection with FIG. 2A.

FIGS. 6A-6L illustrate cross-sectional side views showing a method of forming an FOPLP comprising warpage control structures in accordance with another embodiment. The method shown in FIGS. 6A-6L omits one or more components and/or structures known in the art for simplicity and to avoid obscuring and/or convoluting one or more of the inventive concepts described herein. Furthermore, the method shown in FIGS. 6A-6L may include some operations that are similar to or the same as the operations described above in connection with FIGS. 3A-3I. For brevity, these similar/same operations are not described in detail below in connection with FIGS. 6A-6L, unless such description is necessary to avoid obscuring the inventive concepts described herein.

Figure 6A:
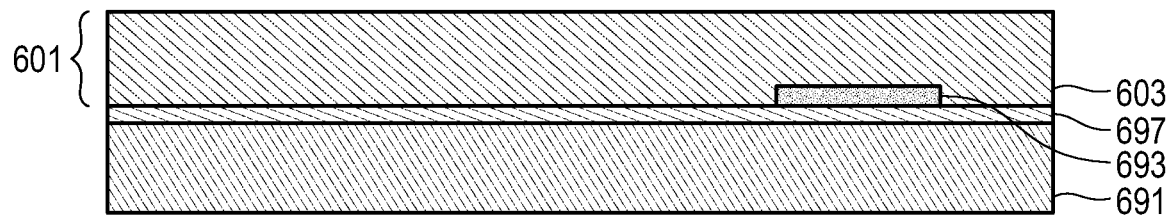
FIGS. 6A-6L illustrate cross-sectional side views showing a method of forming an FOPLP comprising warpage control structures in accordance with another embodiment.

The method shown in FIGS. 6A-6L is one example of an SAP. With regard now to FIG. 6A, a package substrate 601 is provided. The package substrate 601 is similar to or the same as the package substrate 501 described above in connection with FIGS. 5A-5M. For example, and as shown in FIG. 6A, the package substrate 601 includes a pad 693 formed therein.

The package substrate 601 is on a carrier substrate 691, which is similar to or the same as the carrier substrate 591 described above in connection with FIGS. 5A-5M. The carrier substrate 691 may be attached to the package substrate 601 using an adhesive layer 697. The adhesive layer 697 can be similar to or the same as one or more of the adhesive layers described above in connection with FIGS. 2A-5M. For one embodiment, the SAP process flow used for the package substrate 601 includes depositing an insulating layer 603. The insulating layer 603 may comprise any suitable material such as, for example, a polymer. One example of a suitable material for the insulating layer 603 is an epoxy dielectric material (e.g., an ABF, any other suitable epoxy dielectric material, etc.). The insulating layer 603 can be similar to or the same as the insulating layer 503 described above in connection with FIGS. 5A-5M.

Referring again to FIG. 6A, the SAP process flow can include processing the insulating layer 603 using a suitable surface roughening technique known in the art. This technique can include abrading a top surface of the insulating layer 503 (mechanically, chemically, or both) to improve the adhesion of insulating layer 603 with subsequently formed layers and features (e.g., metal layer(s), dielectric layers, adhesive layers, interconnects, etc.).

Figure 6B:
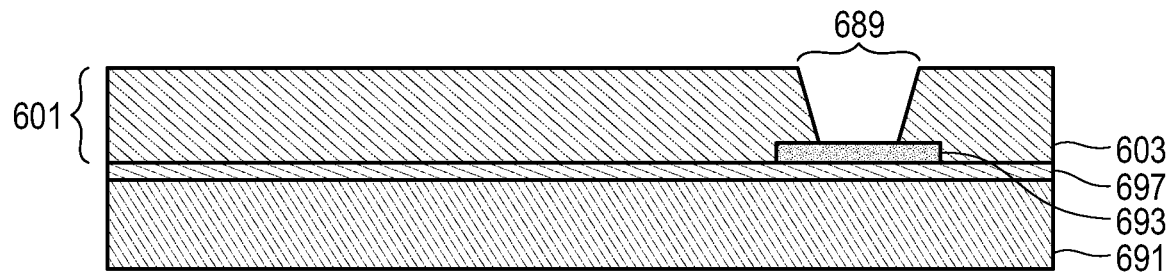

With regard now to FIG. 6B, the SAP process flow can include processing the insulating layer 603 (e.g., using laser drilling techniques, any other suitable techniques, etc.) to create an opening 689 over a top side of the contact pad 693. For one embodiment, a desmearing operation may be performed to remove any residue in the opening 689 after its formation.

Figure 6C:
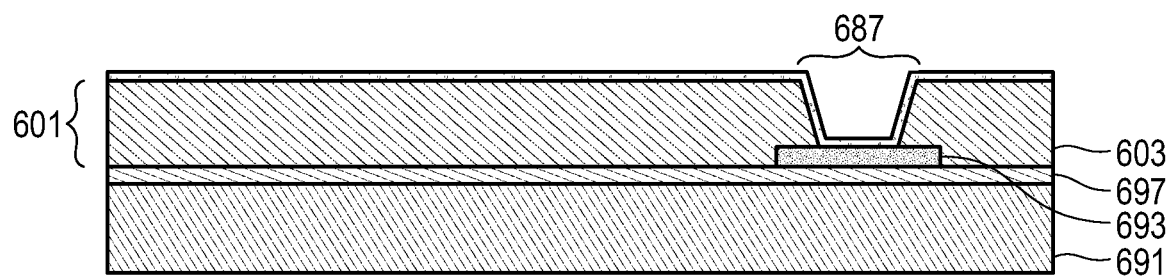

Moving on to FIG. 6C, a metallic material 685 is deposited on the insulating layer 603 and in the opening 689. Depositing the metallic material 685 in the opening 689 creates a conductive via 687. Any suitable deposition technique or combination of deposition techniques may be used (e.g., electroless plating, etc.).

Figure 6D:
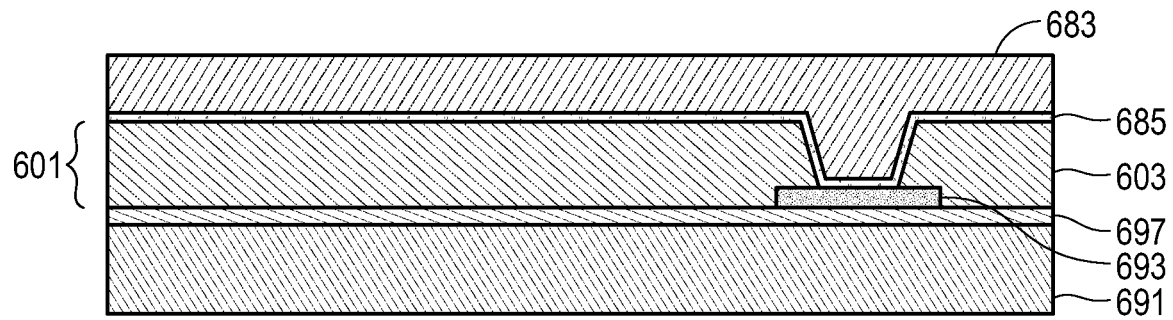

Moving on to FIG. 6D, a resist layer 683 is deposited on the metallic material 685 and in the conductive via 587. For an embodiment, the resist layer 683 is similar to or the same as the resist layer 583 described above in connection with FIGS. 5A-5M.

Figure 6E:
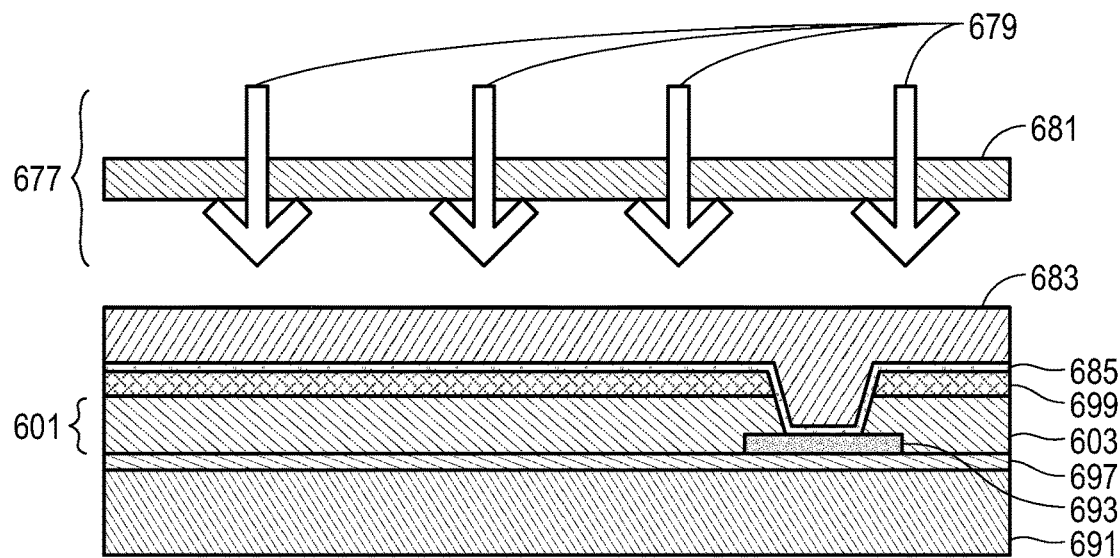

With regard now to FIG. 6E, the resist layer 683 is patterned using one or more lithography techniques 677. For example, and as shown in FIG. 6E, the lithography technique(s) 677 may comprise using light 679 (e.g., ultra-violet (UV), etc.) passing through a photomask 681 to expose one or more portions of the resist layer 683. Any lithography technique or combination of lithography techniques known in the art can be used.

Figure 6F:
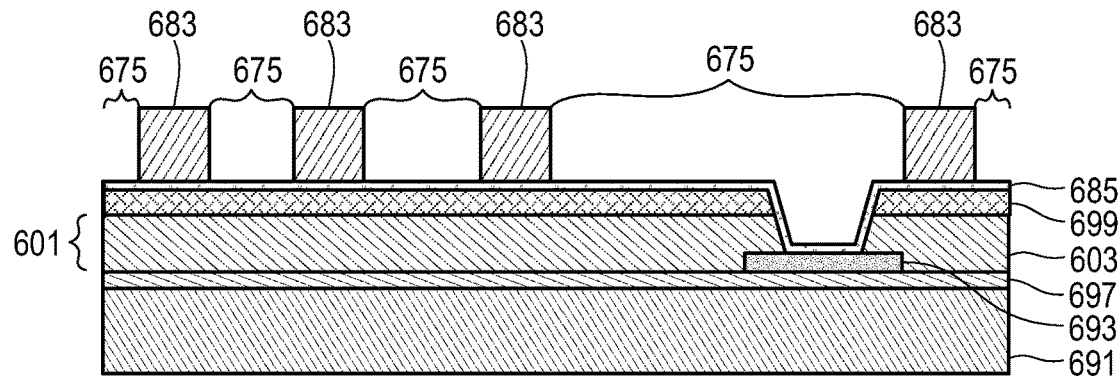

With regard now to FIG. 6F, the exposed resist layer 683 described above may be processed using a removal technique, which can, for example, include removing, stripping, etching, or dissolving away the (un)exposed portions of the resist layer 683 to reveal a pattern comprising openings 675. The transferred pattern can include, but is not limited to, a pattern for one or more warpage control structures 673. The warpage control structures 673 provide functions and/or advantages that are similar to or the same as the warpages structures described above in connection with FIGS. 2A-5M.

Figure 6G:
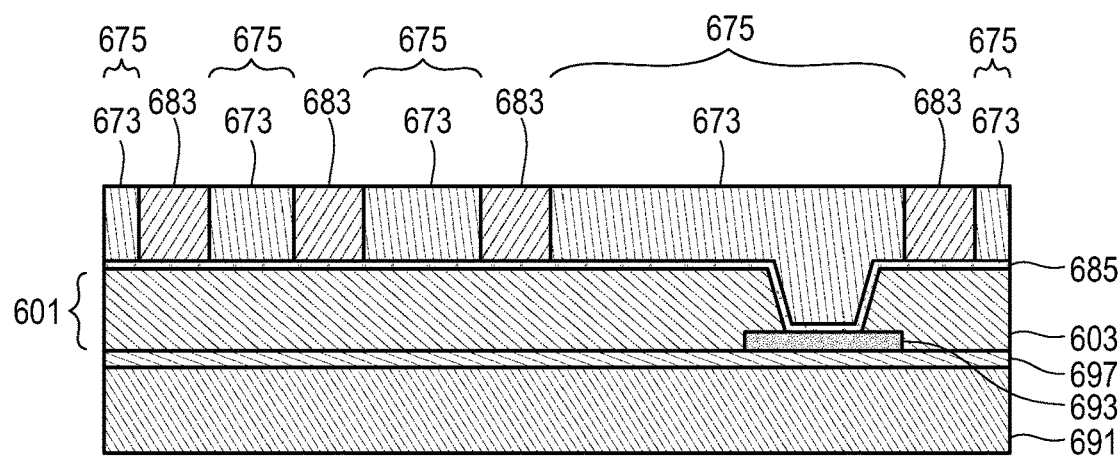

Referring now to FIG. 6G, warpage control structures 673 may be formed in the openings 675 of the patterned resist layer 683. For one or more embodiments, forming warpage control structures 673 may include depositing one or more metallic materials onto surfaces of the metallic material 685 that are not covered by the resist layer 675. In this way, the openings 675 are filled, at least partially, with metallic material(s). For one embodiment, forming warpage control structures 673 is performed in accordance with the formation of the warpage control structures 573 described above in connection with at least FIGS. 5A-5M.

Figure 6H:
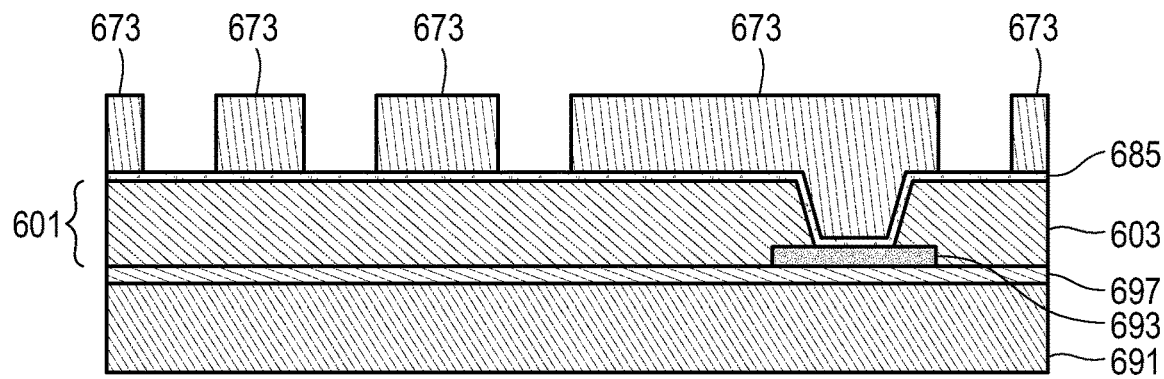

With regard now to FIG. 6H, any remaining portion of the (un)exposed resist layer 683 may be removed to isolate the warpage control structures 673. Additionally, any portion of the seed layer 685 that is not under a warpage control structure 573 is removed. Any suitable removal technique or combination of techniques may be used (e.g., etching, etc.).

Figure 6I:
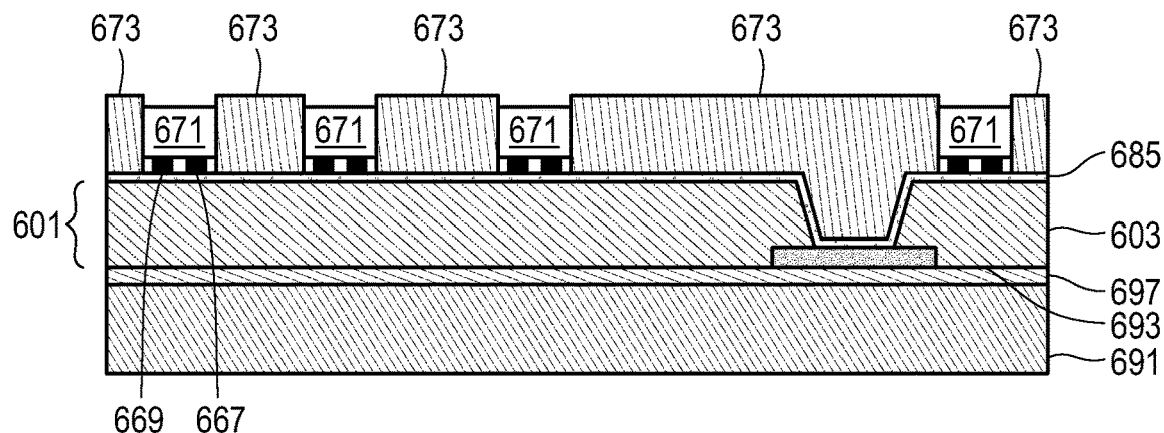

Moving on to FIG. 6I, semiconductor dies 671 are mounted on the insulating layer 603 (which may comprise an adhesive layer as its top layer) in openings between the warpage control structures 673. The plurality of dies 671 may be transferred using a suitable technique such as a pick and place machine. As shown, in FIG. 6I, each of the semiconductor dies 671 includes a passivation layer 669 and exposed contact pads 667. For one embodiment, top sides of the dies 671 may or may not be co-planar with top sides of the warpage control structures 673. For example, the dies 671 may have a z-height that is equal to, greater than, or less than a z-height of the warpage control structures 673.

Figure 6J:
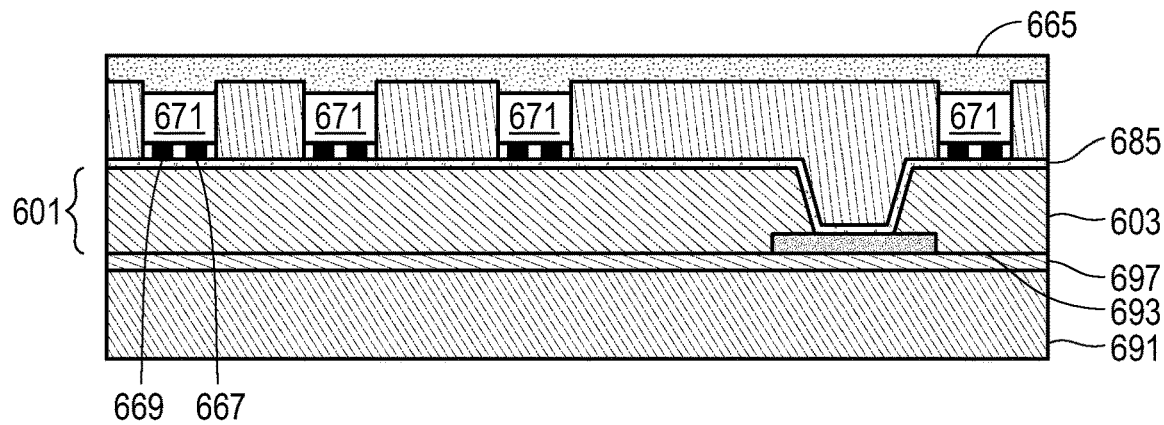

Referring now to FIG. 6J, the semiconductor dies 671 and the warpage control structures 673 are encapsulated in a mold compound 665 on the insulating layer 603. As explained above, encapsulating does not require all sides of the semiconductor dies 671 and/or the warpage control structures 673 to be encapsulated. Furthermore, an amount of the mold compound 665 may be controlled or removed to achieve a specified z-height, as described above in connection with FIGS. 5A-5M.

Figure 6K:
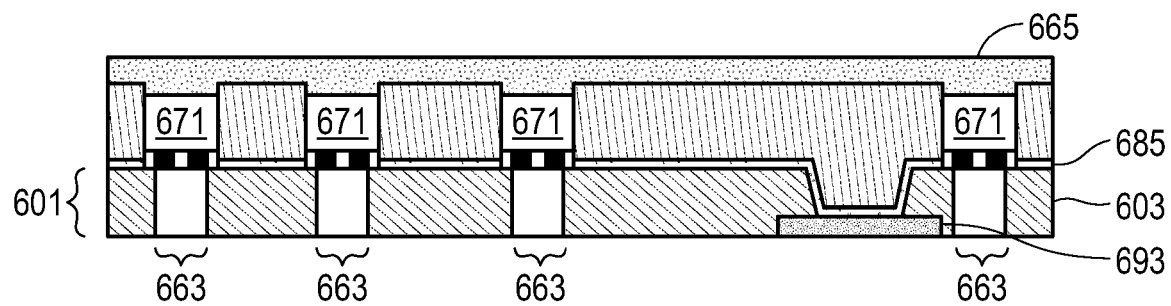

Moving on FIG. 6K, the carrier substrate 691 and the adhesive layer 697 used to attach the carrier substrate 691 to the package substrate 601 may be removed before, during, or after application of the mold compound 665. Furthermore, and as shown in FIG. 6K, the package substrate 601 and the insulating layer 603 can be processed (e.g., using laser drilling techniques, any other suitable techniques, etc.) to create one or more interconnects 663 (e.g., conductive vias, pads, etc.). In this way, a plurality of embedded dies 671 with interconnects 663 (e.g., conductive vias, pads, etc.) to contact pads 567 are formed.

Figure 6L:
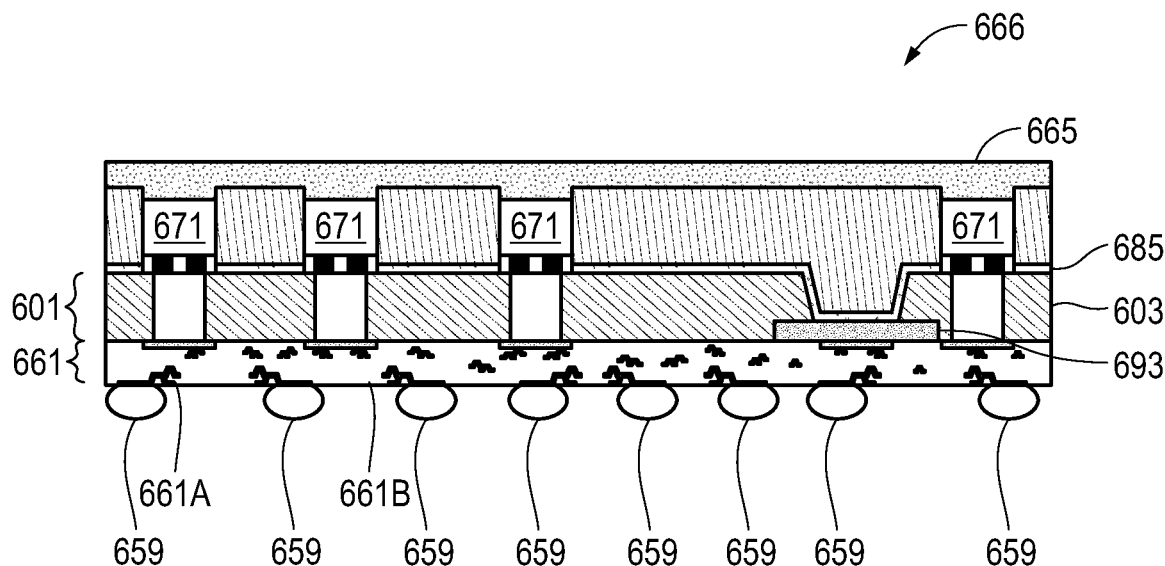

Referring now to FIG. 6L, one or more redistribution layers 661 are formed over bottom sides of the package substrate 601 and insulating layer 603 having interconnects 663 under the contact pads 667. For example, three redistribution layers 661 are formed on bottom sides of the package substrate 601 and insulating layer 603 having interconnects 663.

For one embodiment, the redistribution layer(s) 661 include one or more interconnects 661A and passivation layers 661B. The redistribution layer(s) 661 can be similar to or the same as the redistribution layer(s) 561 described above in connection with FIGS. 5A-5M.

Referring again to FIG. 6L, an FOPLP 655 is formed after the operations described above in connection with FIGS. 6A-6L are performed. The FOPLP 655 includes one or more warpage control structures 673. Furthermore, and as shown in FIG. 6L, conductive bumps 659 (e.g., solder balls, etc.) are formed on a bottom side of the redistribution layer(s) 661. For one embodiment, the FOPLP 655 is similar to or the same as the semiconductor package 200 described above in connection with FIG. 2A.

FIGS. 7A-7M illustrate cross-sectional side views showing a method of forming an FOPLP comprising warpage control structures in accordance with yet another embodiment. The method shown in FIGS. 7A-7M omits one or more components and/or structures known in the art for simplicity and to avoid obscuring and/or convoluting one or more of the inventive concepts described herein. Furthermore, the method shown in FIGS. 7A-7M may include some operations that are similar to or the same as the operations described above in connection with FIGS. 3A-6L. For brevity, these similar/same operations are described in detail below in connection with FIGS. 7A-7M, unless such description is necessary to avoid obscuring the inventive concepts described herein.

The method shown in FIGS. 7A-7M is one example of an SAP. With regard now to FIG. 7A, a carrier substrate 701 is provided, which is similar to or the same as the carrier substrate 591 described above in connection with FIGS. 5A-5M. For one embodiment, the SAP process flow includes depositing an adhesive layer 703 on the carrier substrate 701. Furthermore, an insulating layer 705 is deposited (e.g., laminated, etc.) on the adhesive layer 703. The insulating layer 705 may comprise any suitable material such as, for example, a polymer. One example of a suitable material for the insulating layer 705 is an epoxy dielectric material (e.g., an ABF, any other suitable epoxy dielectric material, etc.). The insulating layer 705 can be similar to or the same as the insulating layer 503 described above in connection with FIGS. 5A-5M. The insulating layer 705 can be formed from one or more photoimageable dielectric (PID) materials, for one embodiment.

Figure 7A:
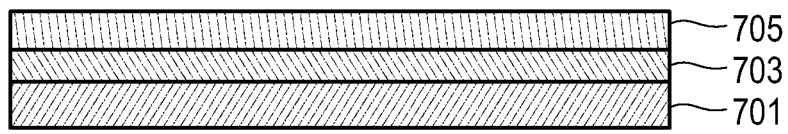
FIGS. 7A-7M illustrate cross-sectional side views showing a method of forming an FOPLP comprising warpage control structures in accordance with yet another embodiment.
Figure 7B:
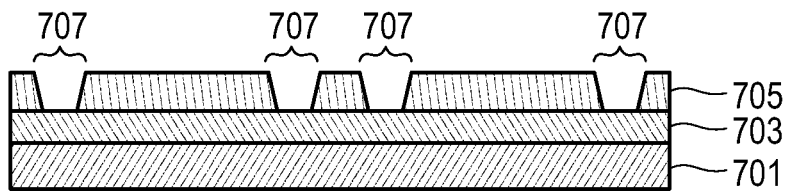

With regard now to FIG. 7B, the SAP process flow can include processing the insulating layer 705 (e.g., using laser drilling techniques, lithography techniques, any other suitable techniques, etc.) to create openings 707 that reveal portions of the adhesive layer 703. Furthermore, a desmearing operation may be performed to remove any residue in the openings 707 after its formation.

Figure 7C:
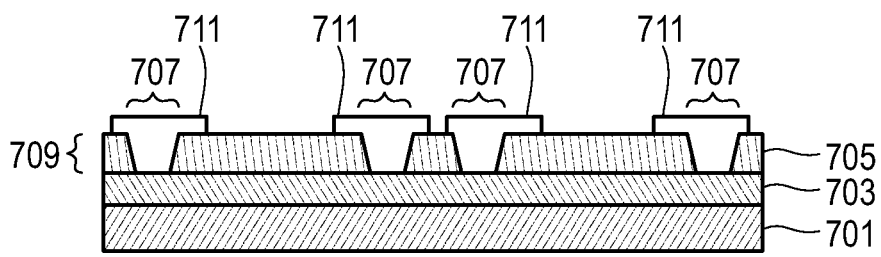

Moving on to FIG. 7C, the SAP process flow can include forming a first redistribution layer 709 by depositing a metallic material 711 on the adhesive layer 703 and in the openings 707. Depositing the metallic material 711 in the openings 707 creates interconnects 713 (e.g., conductive vias, pads, etc.). Any suitable deposition technique or combination of deposition techniques may be used (e.g., electroless plating, etc.).

Figure 7D:
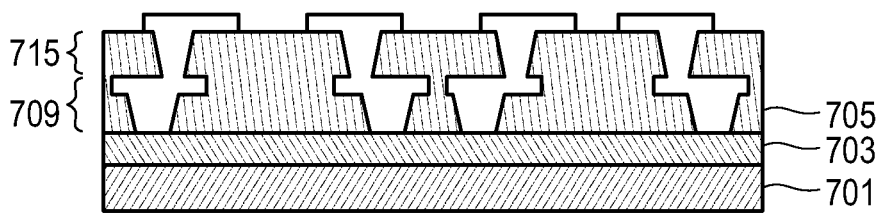

Moving on to FIG. 7D, a second redistribution layer 715 is formed from another insulating layer. The second redistribution layer 715 may comprise interconnects formed in openings of the insulating layer. The insulating layer, interconnects, and openings in the second redistribution layer 715 are similar to or the same as the insulating layer, interconnects, and openings described above in connection with FIGS. 7A-7C.

Figure 7E:
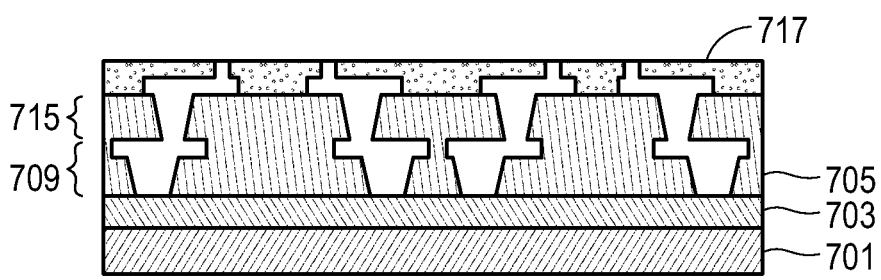

With regard now to FIG. 7E, a third redistribution layer 717 is formed from yet another insulating layer. The third redistribution layer 717 may comprise interconnects formed in openings of the insulating layer. The insulating layer, interconnects, and openings in the third redistribution layer 717 are similar to or the same as the insulating layer, interconnects, and openings described above in connection with FIGS. 7A-7D.

Figure 7F:
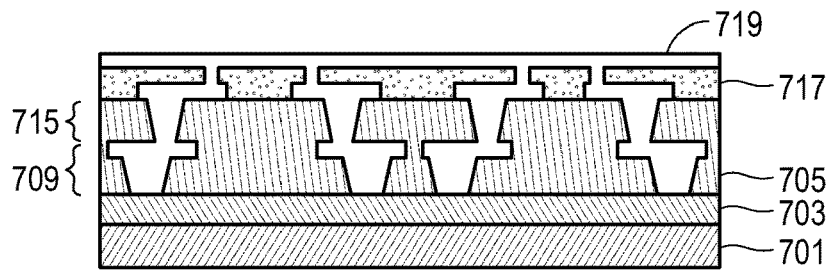

With regard now to FIG. 7F, a seed layer 719 is deposited on the third redistribution layer 717. The seed layer 719 can be deposited using any suitable technique (e.g., electroless plating, etc.). For one embodiment, the seed layer 719 has a thickness (e.g., a z-height, etc.) that is approximately equal to or greater than 0.4 µm. For one embodiment, the seed layer 719 has a thickness (e.g., a z-height, etc.) that is approximately equal to or less than 0.8 µm.

Figure 7G:
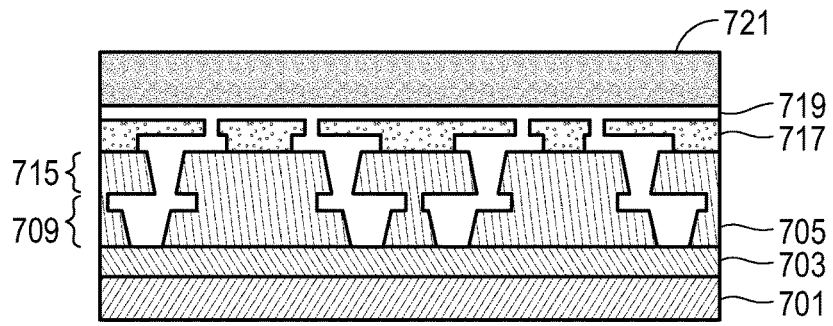

Moving on to FIG. 7G, a resist layer 721 is deposited on the seed layer 719. For an embodiment, the resist layer 721 is similar to or the same as the resist layer 583 described above in connection with FIGS. 5A-5M.

Figure 7H:
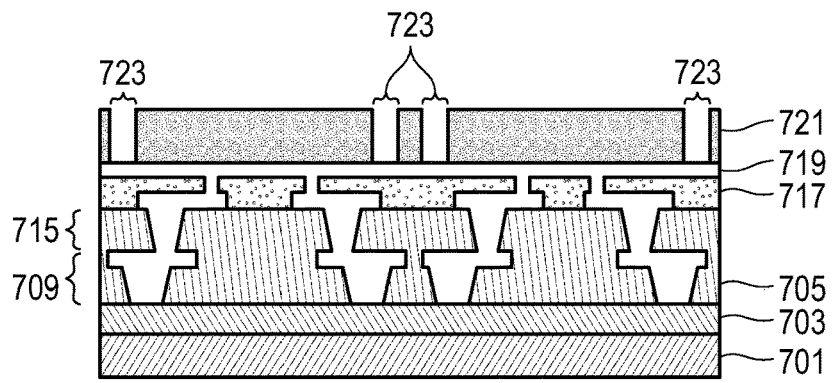

With regard now to FIG. 7H, the resist layer 721 is patterned using one or more lithography techniques (not shown in FIGS. 7A-7M). For example, the lithography technique(s) may comprise using light (e.g., ultra-violet (UV), etc.) passing through a photomask to expose one or more portions of the resist layer 721. Any lithography technique or combination of lithography techniques known in the art can be used (e.g., as described above in connection with one or more of the preceding Figures, etc.). For one embodiment, the resist layer 721 has a thickness (e.g., a z-height, etc.) that is approximately equal to or greater than 15 µm. For one embodiment, the resist layer 721 has a thickness (e.g., a z-height, etc.) that is approximately equal to or less than 300 µm.

With regard again to FIG. 7H, the exposed resist layer 721 described above may be processed using a removal technique, which can, for example, include removing, stripping, etching, or dissolving away the (un)exposed portions of the resist layer 721 to reveal a pattern comprising openings 723. The transferred pattern can include, but is not limited to, a pattern for one or more warpage control structures. The warpage control structures provide functions and/or advantages that are similar to or the same as the warpages structures described above in connection with at least FIGS. 2A-6L.

Figure 7I:
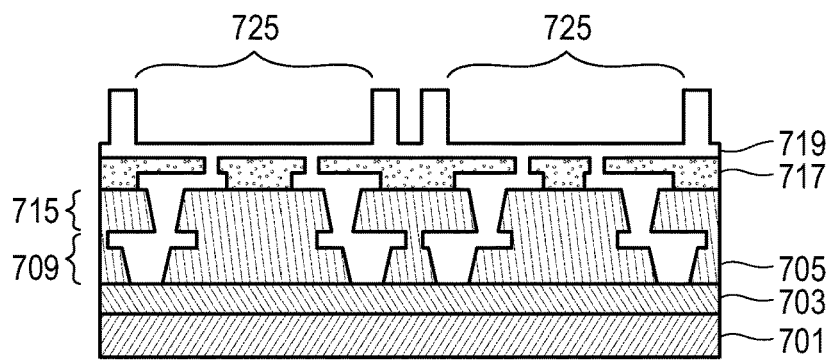

Referring now to FIG. 7I, warpage control structures 725 may be formed in the openings 723 of the patterned resist layer 721. For one or more embodiments, forming warpage control structures 725 may include depositing one or more metallic materials onto surfaces of the seed layer 719 that are not covered by the resist layer 721 so as to fill (at least partially) the openings 723. For one embodiment, forming warpage control structures 725 is performed in accordance with the formation of the warpage control structures 573 described above in connection with FIGS. 5A-5M.

Figure 7J:
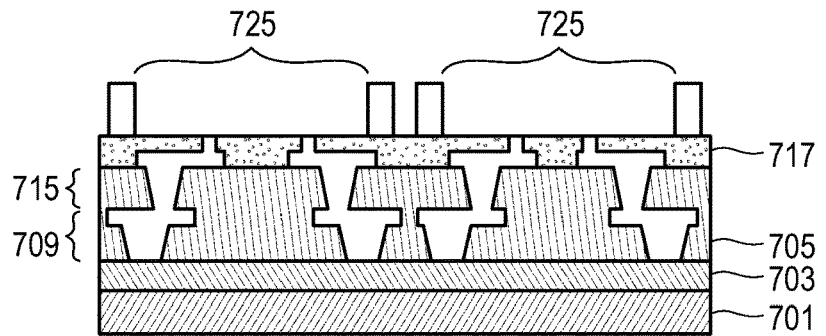

With regard again to FIG. 7I, any remaining portion of the (un)exposed resist layer 721 may be removed to isolate the warpage control structures 725. In FIG. 7J, any portion of the seed layer 719 that is not under a warpage control structure 725 is removed to reveal top portions of the third redistribution layer 717. Any suitable removal technique or combination of techniques may be used (e.g., etching, etc.).

Figure 7K:
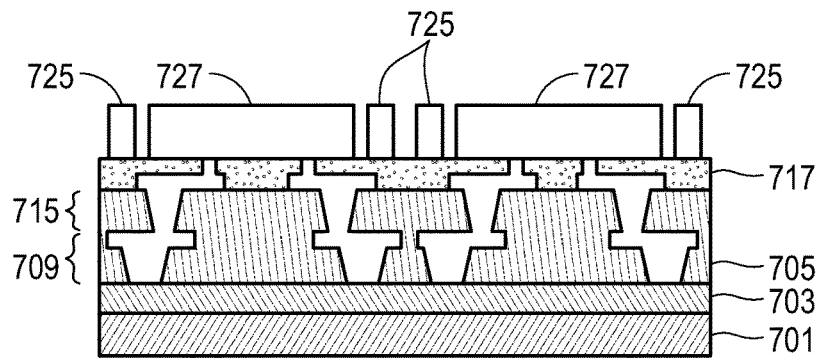

Moving on to FIG. 7K, semiconductor dies 727 are mounted on the top portions of the third redistribution layer 717 in openings between the warpage control structures 725. The plurality of dies 727 may be transferred using a suitable technique such as a pick and place machine. Each of the semiconductor dies 727 includes a passivation layer (not shown) and exposed contact pads (not shown). For one embodiment, top sides of the dies 727 may or may not be co-planar with top sides of the warpage control structures 725. For example, the dies 727 may have a z-height that is equal to, greater than, or less than a z-height of the warpage control structures 725.

Figure 7L:
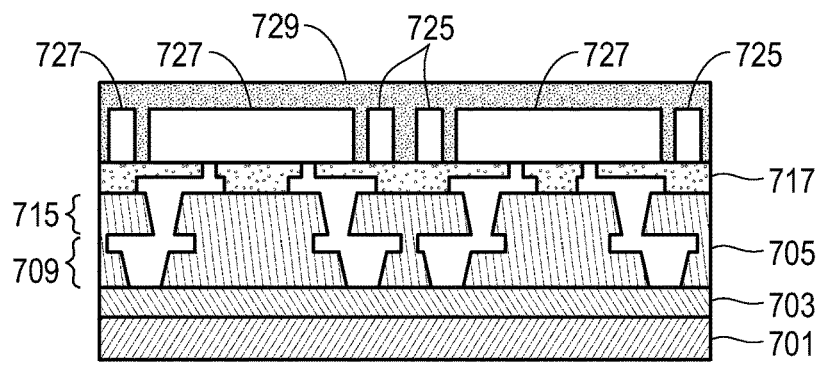

Referring now to FIG. 7L, the semiconductor dies 727 and the warpage control structures 725 are encapsulated in a mold compound 729 on the third redistribution layer 717. As explained above, encapsulating does not require all sides of the semiconductor dies 727 and/or the warpage control structures 725 to be encapsulated. Furthermore, an amount of the mold compound 729 may be controlled or removed to achieve a specified thickness (e.g., a z-height, etc.), as described above in connection with FIGS. 5A-5M.

Figure 7M:
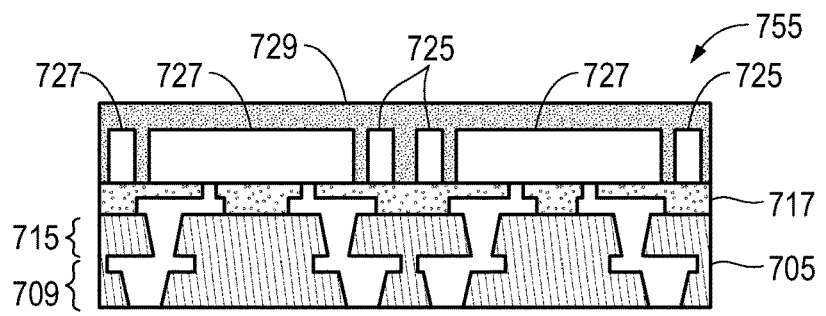

Moving to FIG. 7M, the carrier substrate 701 and the adhesive layer 703 may be removed after application of the mold compound 729. An FOPLP 755 is formed after the operations described above in connection with FIGS. 7A-7M are performed. The FOPLP 755 includes one or more warpage control structures 725. Furthermore, conductive bumps (e.g., solder balls, etc.) that are not shown in FIG. 7M can be formed on a bottom side of the redistribution layer 709. For one embodiment, the FOPLP 755 is similar to or the same as the semiconductor package 200 described above in connection with FIG. 2A.

Figure 8:
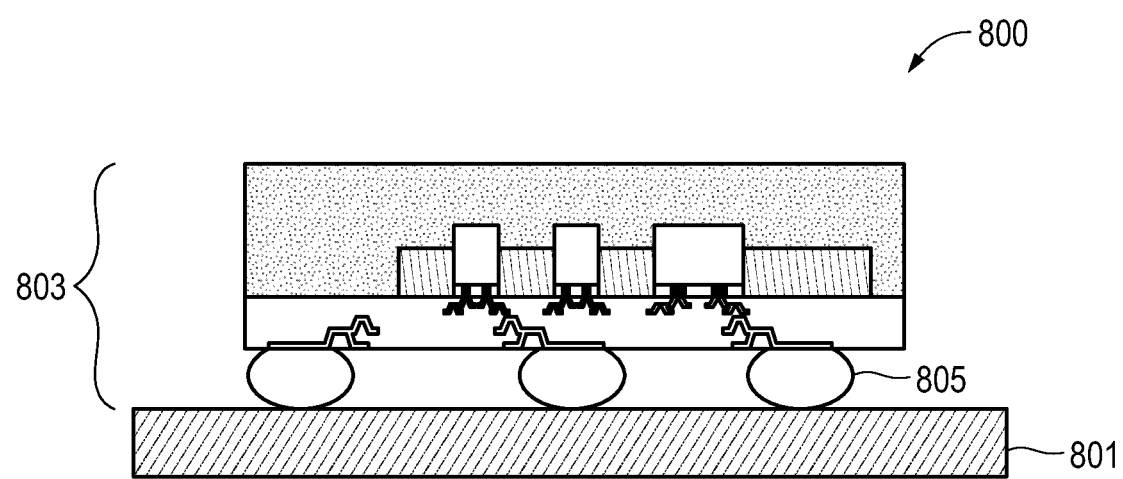
FIG. 8 is a cross-sectional illustration of a packaged system, in accordance with an embodiment.

Referring now to FIG. 8, a cross-sectional illustration of a packaged system 800 is shown, in accordance with an embodiment. For an embodiment, the packaged system 800 may include an FOPLP 803 (e.g., one of the FOPLPs described above in connection with at least FIGS. 1-3I, etc.). The FOPLP 803 may be electrically coupled to a board, such as a printed circuit board (PCB) 801, with solder bumps 805 and/or with any suitable interconnect architecture, such as wire bonding or the like.

One or more features formed based on one or more of the embodiments described above may be integrated into one or more of: (i) the FOPLP 803; and (ii) the board 801. Embodiments include any number of one or more features formed into the FOPLP 803 and/or the board 801.

Figure 9:
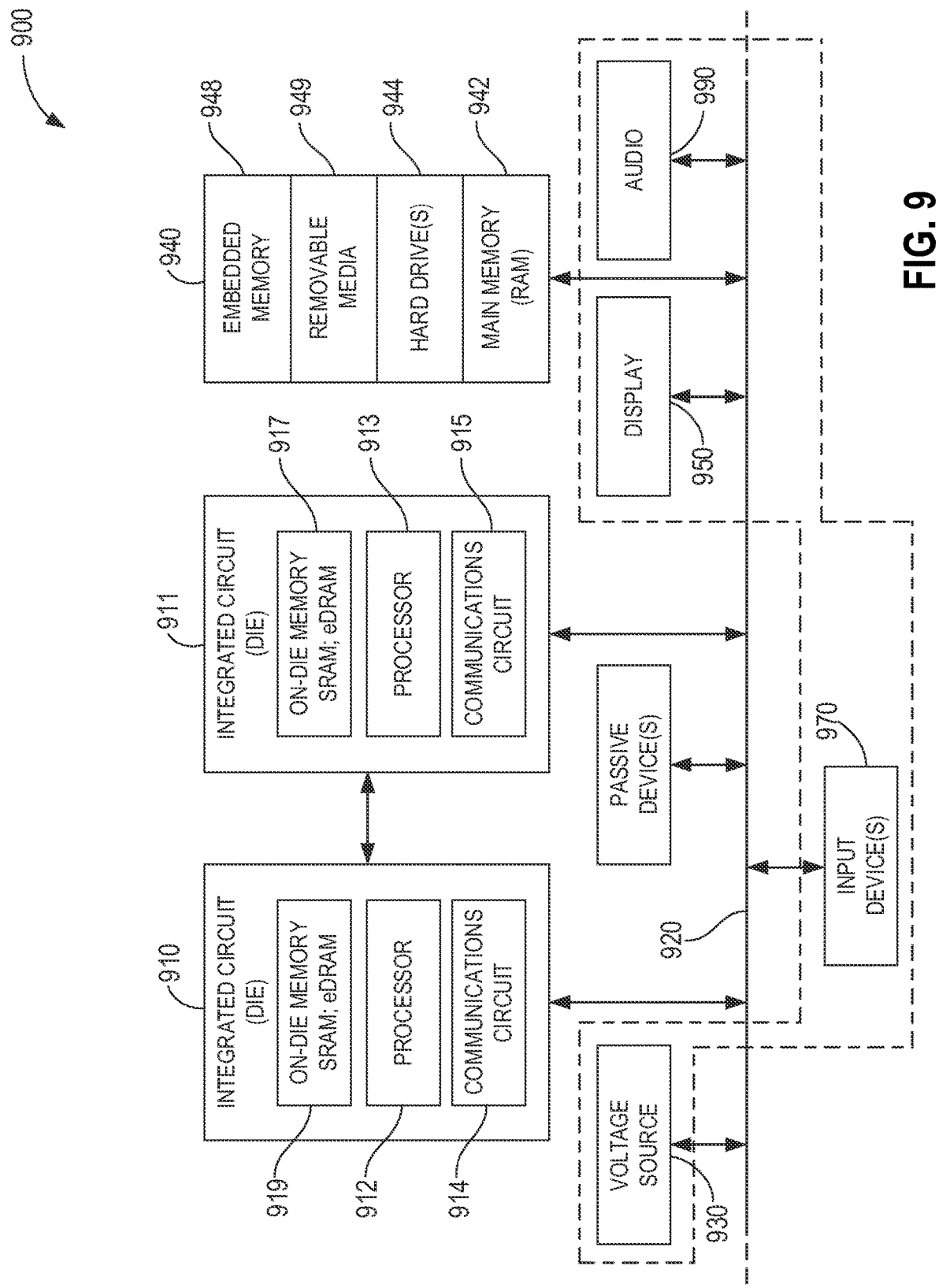
FIG. 9 illustrates a schematic of computer system according to an embodiment.

FIG. 9 illustrates a schematic of computer system 900 according to an embodiment. The computer system 900 (also referred to as an electronic system 900) can include an FOPLP having warpage control structures formed therein that is in accordance with any of the embodiments and their equivalents as set forth in this disclosure. The computer system 900 may be a mobile device, a netbook computer, a wireless smart phone, a desktop computer, a hand-held reader, a server system, a supercomputer, or a high-performance computing system.

The system 900 can be a computer system that includes a system bus 920 to electrically couple the various components of the electronic system 900. The system bus 920 is a single bus or any combination of busses according to various embodiments. The electronic system 900 includes a voltage source 930 that provides power to the integrated circuit 910. For one embodiment, the voltage source 930 supplies current to the integrated circuit 910 through the system bus 920.

The integrated circuit 910 is electrically coupled to the system bus 920 and includes any circuit, or combination of circuits according to an embodiment. For an embodiment, the integrated circuit 910 includes a processor 912. As used herein, the processor 912 may mean any type of circuit such as, but not limited to, a microprocessor, a microcontroller, a graphics processor, a digital signal processor, or another processor. For an embodiment, the processor 912 includes, or is coupled with, an FOPLP comprising warpage control structures in accordance with any of the embodiments and their equivalents, as described in the foregoing specification. For an embodiment, SRAM embodiments are found in memory caches of the processor. Other types of circuits that can be included in the integrated circuit 910 are a custom circuit or an application-specific integrated circuit (ASIC), such as a communications circuit 914 for use in wireless devices such as cellular telephones, smart phones, pagers, portable computers, two-way radios, and similar electronic systems, or a communications circuit for servers. For an embodiment, the integrated circuit 910 includes on-die memory 919 such as static random-access memory (SRAM). For an embodiment, the integrated circuit 910 includes embedded on-die memory 919 such as embedded dynamic random-access memory (eDRAM). For one embodiment, the on-die memory 919 may be packaged with a process in accord with any of the embodiments and their equivalents, as described in the foregoing specification.

For an embodiment, the integrated circuit 910 is complemented with a subsequent integrated circuit 911. Useful embodiments include a dual processor 913 and a dual communications circuit 915 and dual on-die memory 917 such as SRAM. For an embodiment, the dual integrated circuit 910 includes embedded on-die memory 917 such as eDRAM.

For an embodiment, the electronic system 900 also includes an external memory 940 that in turn may include one or more memory elements suitable to the particular application, such as a main memory 942 in the form of RAM, one or more hard drives 944, and/or one or more drives that handle removable media 949, such as diskettes, compact disks (CDs), digital variable disks (DVDs), flash memory drives, and other removable media known in the art. The external memory 940 may also be embedded memory 948 such as the first die in a die stack, according to an embodiment.

For an embodiment, the electronic system 900 also includes a display device 950 and an audio output 990. For an embodiment, the electronic system 900 includes an input device such as a controller 970 that may be a keyboard, mouse, trackball, game controller, microphone, voice-recognition device, or any other input device that inputs information into the electronic system 900. For an embodiment, an input device 970 is a camera. For an embodiment, an input device 970 is a digital sound recorder. For an embodiment, an input device 970 is a camera and a digital sound recorder.

At least one of the integrated circuits 910 or 911 can be implemented in a number of different embodiments, including an FOPLP comprising warpage control structures as described herein, an electronic system, a computer system, one or more methods of fabricating an integrated circuit, and one or more methods of fabricating an electronic assembly that includes an FOPLP comprising warpage control structures, according to any disclosed embodiments set forth herein and their art-recognized equivalents. The elements, materials, geometries, dimensions, and sequence of operations can all be varied to suit particular I/O coupling requirements including array contact count, array contact configuration for a microelectronic die embedded in a processor mounting substrate comprised of, attached to, or coupled to an FOPLP comprising warpage control structures in accordance with any of the disclosed embodiments as set forth herein and their art-recognized equivalents. A foundation substrate may be included, as represented by the dashed line of FIG. 9. Passive devices may also be included, as is also depicted in FIG. 9.

Reference throughout this specification to "one embodiment," "an embodiment," "another embodiment" and their variations means that a particular feature, structure, configuration, or characteristic described in connection with the embodiment is included in at least one embodiment. Thus, the appearances of the phrase "for one embodiment," "for an embodiment," "for another embodiment," "in one embodiment," "in an embodiment," "in another embodiment," or their variations in various places throughout this specification are not necessarily referring to the same embodiment. Furthermore, the particular features, structures, configurations, or characteristics may be combined in any suitable manner in one or more embodiments.

The terms "over," "to," "between," "onto," and "on" as used in the foregoing specification refer to a relative position of one layer with respect to other layers. One layer "over" or "on" another layer or bonded "to" or in "contact" with another layer may be directly in contact with the other layer or may have one or more intervening layers. One layer "between" layers may be directly in contact with the layers or may have one or more intervening layers.

The descriptions provided above in connection with one or more embodiments described herein, which are included as part of a process of forming semiconductor packages (e.g., FOPLPs, etc.), may also be used for other types of IC packages and mixed logic-memory package stacks. In addition, the processing sequences may be compatible with both wafer level packages (WLP), and integration with surface mount substrates such as LGA, QFN, and ceramic substrates.

In the foregoing specification, abstract, and/or figures, numerous specific details are set forth, such as specific materials and processing operations, in order to provide a thorough understanding of embodiments described herein. It will, however, be evident that any of the embodiments described herein may be practiced without these specific details. In other instances, well-known features, such as the integrated circuitry of semi conductive dies, are not described in detail in order to not unnecessarily obscure embodiments described herein. Furthermore, it is to be understood that the various embodiments shown in the Figures and described in connection with the Figures are illustrative representations and are not necessarily drawn to scale. Thus, various modifications and/or changes may be made without departing form the broader spirit and scope of the embodiments described in connection with the foregoing specification, abstract, and/or Figures. As used herein, the phrases "A or B", "A and/or B", "one or more of A and B", and "at least one of A or B" means (A), (B), or (A and B).

Examples of conductive lines include, but are not limited to, microstrip conductive lines and stripline conductive lines. Examples of microstrip conductive lines include, but are not limited to, regular microstrip conductive lines, edge-coupled microstrip conductive lines, and embedded microstrip conductive lines. Examples of stripline conductive lines include, but are not limited to, symmetric or regular stripline conductive lines, asymmetric stripline conductive lines, edge-coupled stripline conductive lines, and broadside-coupled stripline. Metallic materials, as used herein, may be formed from any suitable material that is electrically conductive and/or magnetically inductive.

Embodiments described herein include a fan-out panel level package (FOPLP), comprising: one or more redistribution layers; a semiconductor die on the one or more redistribution layers; one or more warpage control structures adjacently located next to the semiconductor die; and a mold compound encapsulating the semiconductor die and the one or more warpage structures on the one or more redistribution layers.

Additional embodiments described herein include an FOPLP, wherein at least one of the one or more warpage control structures is formed from metal.

Additional embodiments described herein include an FOPLP, wherein the metal comprises copper.

Additional embodiments described herein include an FOPLP, further comprising an insulating layer between the one or more redistribution layers and the semiconductor die.

Additional embodiments described herein include an FOPLP, wherein the insulating layer comprises a dielectric material.

Additional embodiments described herein include an FOPLP, wherein an interconnect of the one or more redistribution layers is bonded to a contact pad of the semiconductor die.

Embodiments described herein include a method of forming a fan-out panel level package (FOPLP), comprising: forming a warpage control structure on an adhesive layer, wherein the adhesive layer is on a carrier substrate; transferring a semiconductor die on the adhesive layer, the semiconductor die located adjacent the warpage control structure; encapsulating the semiconductor die and the warpage control structure in a mold compound on the adhesive layer; removing the adhesive layer and the carrier substrate; depositing an insulation layer on bottom sides of the semiconductor die, the warpage structure, and the mold compound; and forming one or more redistribution layers on the insulation layer.

Additional embodiments described herein include a method, wherein forming a warpage control structure comprises: depositing a seed layer on the adhesive layer; depositing a resist layer on the seed layer; patterning the resist layer to create an opening; plating one or more metal layers in the opening; and removing, in response to the plating, remaining portions of the resist layer on the seed layer.

Additional embodiments described herein include a method, further comprising removing the seed layer in response to removing the remaining portions of the resist layer.

Additional embodiments described herein include a method, further comprising planarizing a top side of the mold compound.

Additional embodiments described herein include a method, wherein the insulation layer is formed from a dielectric material.

Additional embodiments described herein include a method, further comprising forming, through the insulation layer, one or more vias on contact pads of the semiconductor die.

Additional embodiments described herein include a method, wherein forming, through the insulation layer, one or more vias under contact pads of the semiconductor die comprising forming the one or more vias using a laser drilling technique.

Embodiments described herein include a system, comprising: a printed circuit board (PCB), a fan-out panel level package (FOPLP) on the PCB, the FOPLP comprising: one or more redistribution layers; a semiconductor die on the one or more redistribution layers; one or more warpage control structures adjacently located next to the semiconductor die; and a mold compound encapsulating the semiconductor die and the one or more warpage control structures on the redistribution layer.

Additional embodiments described herein include a system, wherein conductive bumps couple the FOPLP to the PCB.

Additional embodiments described herein include a system, wherein at least one of the one or more warpage control structures is formed from metal.

Additional embodiments described herein include a system, wherein the metal comprises copper.

Additional embodiments described herein include a system, further comprising an insulating layer between the one or more redistribution layers and the semiconductor die.

Additional embodiments described herein include a system, wherein the insulating layer comprises a dielectric material.

Additional embodiments described herein include a system, wherein an interconnect of the one or more redistribution layers is bonded to a contact pad of the semiconductor die.

Embodiments described herein include a fan-out panel level package (FOPLP), comprising: one or more redistribution layers; a primer layer on the one or more redistribution layers; a semiconductor die on the primer layer; one or more warpage control structures adjacently located next to the semiconductor die; and a mold compound encapsulating the semiconductor die and the one or more warpage structures on the primer layer.

Additional embodiments described herein include an FOPLP, wherein at least one of the one or more warpage control structures is formed from metal.

Additional embodiments described herein include an FOPLP, wherein the metal comprises copper.

Additional embodiments described herein include an FOPLP, further comprising an insulating layer between the one or more redistribution layers and the primer layer.

Additional embodiments described herein include an FOPLP, wherein one or more of the primer layer and the insulating layer comprises one or more dielectric materials.

Additional embodiments described herein include an FOPLP, wherein an interconnect of the one or more redistribution layers is bonded to a contact pad of the semiconductor die.

Embodiments described herein include a method of forming a fan-out panel level package (FOPLP), comprising: forming a warpage control structure on a primer layer, wherein the primer layer is on an insulating layer, and wherein the insulating layer is on a carrier substrate; transferring a semiconductor die on the primer layer, the semiconductor die located adjacent the warpage control structure; encapsulating the semiconductor die and the warpage control structure in a mold compound on the primer layer; removing the carrier substrate; forming one or more interconnects through the insulation layer and the primer layer to bottom sides of the semiconductor die; and forming a redistribution layer on the one or more interconnects, the insulation layer, and the primer layer.

Additional embodiments described herein include a method, wherein forming a warpage control structure comprises: depositing a seed layer on the primer layer; depositing a resist layer on the seed layer; patterning the resist layer to create an opening; plating one or more metal layers in the opening; and removing, in response to the plating, remaining portions of the resist layer on the seed layer.

Additional embodiments described herein include a method, further comprising removing the seed layer in response to removing the remaining portions of the resist layer.

Additional embodiments described herein include a method, further comprising planarizing a top side of the mold compound.

Additional embodiments described herein include a method, wherein one or more of the primer layer and the insulating layer comprises one or more dielectric materials.

Embodiments described herein include a packaged system comprising: a printed circuit board (PCB) and a fan-out panel level package (FOPLP) coupled to the PCB, the FOPLP comprising: one or more redistribution layers; a primer layer on the one or more redistribution layers; a semiconductor die on the primer layer; one or more warpage control structures adjacently located next to the semiconductor die; and a mold compound encapsulating the semiconductor die and the one or more warpage structures on the primer layer.

Additional embodiments described herein include a system, wherein conductive bumps couple the FOPLP to the PCB.

Additional embodiments described herein include a packaged system, wherein at least one of the one or more warpage control structures is formed from metal.

Additional embodiments described herein include a packaged system, wherein the metal comprises copper.

Additional embodiments described herein include a packaged system, further comprising an insulating layer between the one or more redistribution layers and the primer layer.

Additional embodiments described herein include a packaged system, wherein the insulating layer comprises a dielectric material.

Additional embodiments described herein include a packaged system, wherein an interconnect of the one or more redistribution layers is bonded to a contact pad of the semiconductor die.

What is claimed is:

1. A fan-out panel level package (FOPLP), comprising:
   one or more redistribution layers;
   a first semiconductor die and a second semiconductor die on the one or more redistribution layers;
   a plurality of structures comprising a metal, the plurality of structures on the one or more redistribution layers, and the plurality of structures laterally between the first semiconductor die and the second semiconductor die; and
   a mold compound encapsulating the first semiconductor die and the second semiconductor die and the plurality of structures, the mold compound laterally adjacent to and over the first semiconductor die and the second semiconductor die and the structure, the mold compound having a vertical thickness greater than a vertical thickness of the plurality of structures.

2. The FOPLP of claim 1, wherein the metal is copper.

3. The FOPLP of claim 2, wherein the plurality of structures comprises an alloy of copper.

4. The FOPLP of claim 1, wherein the plurality of structures is a plurality of pillars.

5. The FOPLP of claim 1, wherein the plurality of structures is a plurality of bumps.

6. The FOPLP of claim 1, wherein one or both of the first semiconductor die or the second semiconductor die has a vertical thickness greater than the vertical thickness of the plurality of structures.

7. The FOPLP of claim 1, further comprising an additional structure comprising the metal, the additional structure having a vertical thickness different than the vertical thickness of the plurality of structures.

8. The FOPLP of claim 1, further comprising an insulating layer between the one or more redistribution layers and the semiconductor die.

9. The FOPLP of claim 1, wherein an interconnect of the one or more redistribution layers is bonded to a contact pad of one of the first semiconductor die or the second semiconductor die.

10. The FOPLP of claim 1, wherein the plurality of structures is a plurality of warpage control structures.

11. A system comprising:
    a printed circuit board (PCB); and
    a fan-out panel level package (FOPLP) coupled to the PCB, the FOPLP comprising:
    one or more redistribution layers;
    a first semiconductor die and a second semiconductor die on the one or more redistribution layers;
    a plurality of structures comprising a metal, the plurality of structures on the one or more redistribution layers, and the plurality of structures laterally between the first semiconductor die and the second semiconductor die; and
    a mold compound encapsulating the first semiconductor die and the second semiconductor die and the structure, the mold compound laterally adjacent to and over the first semiconductor die and the second semiconductor die and the plurality of structures, the mold compound having a vertical thickness greater than a vertical thickness of the plurality of structures.

12. The system of claim 11, wherein the metal is copper.

13. The system of claim 12, wherein the plurality of structures comprises an alloy of copper.

14. The system of claim 11, wherein the plurality of structures is a plurality of pillars.

15. The system of claim 11, wherein the plurality of structures is a plurality of bumps.

16. The system of claim 11, wherein one or both of the first semiconductor die or the second semiconductor die has a vertical thickness greater than the vertical thickness of the plurality of structures.

17. The system of claim 11, further comprising an additional structure comprising the metal, the additional structure having a vertical thickness different than the vertical thickness of the plurality of structures.

18. The system of claim 11, further comprising an insulating layer between the one or more redistribution layers and the semiconductor die.

19. The system of claim 11, wherein an interconnect of the one or more redistribution layers is bonded to a contact pad of one of the first semiconductor die or the second semiconductor die.

20. The system of claim 11, wherein the plurality of structures is a plurality of warpage control structures.

21. A fan-out panel level package (FOPLP), comprising:
one or more redistribution layers;
a first semiconductor die and a second semiconductor die on the one or more redistribution layers;
a structure comprising a metal, the structure on the one or more redistribution layers, and the structure laterally between the first semiconductor die and the second semiconductor die, wherein the structure is a bump; and
a mold compound encapsulating the first semiconductor die and the second semiconductor die and the structure, the mold compound laterally adjacent to and over the first semiconductor die and the second semiconductor die and the structure, the mold compound having a vertical thickness greater than a vertical thickness of the structure.

22. A fan-out panel level package (FOPLP), comprising:
one or more redistribution layers;
a first semiconductor die and a second semiconductor die on the one or more redistribution layers;
a structure comprising a metal, the structure on the one or more redistribution layers, and the structure laterally between the first semiconductor die and the second semiconductor die;
a second structure comprising the metal, the second structure having a vertical thickness different than the vertical thickness of the structure; and
a mold compound encapsulating the first semiconductor die and the second semiconductor die and the structure, the mold compound laterally adjacent to and over the first semiconductor die and the second semiconductor die and the structure, the mold compound having a vertical thickness greater than a vertical thickness of the structure.

* * * * *